(12) United States Patent
Boyd

(10) Patent No.: US 6,346,764 B1
(45) Date of Patent: Feb. 12, 2002

(54) MULTILAYER PIEZOELECTRIC TRANSFORMER

(75) Inventor: Clark Davis Boyd, Hampton, VA (US)

(73) Assignee: Face International Corp., Norfolk, VA (US)

( * ) Notice: Subject to any disclaimer, the term of this patent is extended or adjusted under 35 U.S.C. 154(b) by 0 days.

(21) Appl. No.: 09/738,830

(22) Filed: Dec. 15, 2000

(51) Int. Cl.[7] .............................................. H01L 41/08
(52) U.S. Cl. .......................... 310/366; 310/358; 310/359
(58) Field of Search ................................... 310/328, 358, 310/359, 366

(56) References Cited

U.S. PATENT DOCUMENTS 5,278,471 A * 1/1994 Uehara et al. ............... 310/328
5,814,922 A * 9/1998 Uchino et al. ............... 310/359
6,040,654 A * 3/2000 Le Letty ...................... 310/366

* cited by examiner

*Primary Examiner*—Mark O. Budd
(74) *Attorney, Agent, or Firm*—Stephen E. Clark; David J. Bolduc

(57) ABSTRACT

A multi-layer piezoelectric transformer (PT) is provided having an insulation layer having an input electroactive ceramic layer bonded to one of its major faces and an output electroactive ceramic layer bonded to its other major face. The input layer is electroded on both major faces and is poled in the thickness direction. The output layer has segmented electrodes patterned on its two opposing major faces and portions of the output layer are alternatingly poled in opposite directions across the output layer's thickness. The configuration of the poling and electrodes places adjacent portions of the output layer electrically in series.

14 Claims, 8 Drawing Sheets

MULTILAYER PIEZOELECTRIC TRANSFORMER

BACKGROUND OF INVENTION

1. Field of Invention

The present invention relates generally to a voltage converter using resonant vibration of multiple piezoelectric ceramic layers. More specifically, the present invention relates to a multilayer piezoelectric transformer having an output portion with a segmented electrode configuration adapted to provide step-up voltage conversion.

2. Description of the Prior Art

Wire wound-type electromagnetic transformers have been used for generating high voltage in internal power circuits of devices such as televisions or fluorescent lamp ballasts. Such electromagnetic transformers take the form of a conductor wound onto a core made of a magnetic substance. Because a large number of turns of the conductor are required to realize a high transformation ratio, electromagnetic transformers that are effective, yet at the same time compact and slim in shape are extremely difficult to produce. Furthermore, in view of high frequency applications, the electromagnetic transformer has many disadvantages involving magnetic material of the electromagnetic transformer, such as sharp increase in hysteresis loss, eddy-current loss and conductor skin-effect loss. Those losses limit the practical frequency range of magnetic transformers to not above 500 kHz.

To remedy this and many other problems of the wire-wound transformer, piezoelectric ceramic transformers (or PTs) utilizing the piezoelectric effect have been provided in the prior art. In contrast to electromagnetic transformers, PTs have a sharp frequency characteristic of the output voltage to input voltage ratio, which has a peak at the resonant frequency. This resonant frequency depends on the material constants and thickness of materials of construction of the transformer including the piezoelectric ceramics and electrodes. Furthermore PTs have a number of advantages over general electromagnetic transformers. The size of PTs can be made much smaller than electromagnetic transformers of comparable transformation ratio, PTs can be made nonflammable, and produce no electromagnetically induced noise.

The ceramic body employed in PTs takes various forms and configurations, including rings, flat slabs and the like. Typical examples of a prior PTs are illustrated in FIGS. 1 and 2. This type of PT is commonly referred to as a "Rosen-type" piezoelectric transformer. The basic Rosen-type piezoelectric transformer was disclosed in U.S. pat. No. 2,830,274 and numerous variations of this basic apparatus are well known in the prior art. The typical Rosen-type PT comprises a flat ceramic slab 20 appreciably longer than it is wide and substantially wider than it is thick. In the case of FIG. 1, the piezoelectric body 20 is in the form of a flat slab that is considerably wider than it is thick, and having greater length than width.

As shown in FIG. 1, a piezoelectric body 20 is employed having some portions polarized differently from others. A substantial portion of the slab 20, the generator portion 22 to the right of the center of the slab is polarized longitudinally, and has a high impedance in the direction of polarization. The remainder of the slab, the vibrator portion 21 is polarized transversely to the plane of the face of the slab (in the thickness direction) and has a low impedance in the direction of polarization. In this case the vibrator portion 21 of the slab is actually divided into two portions. The first portion 24 of the vibrator portion 21 is polarized transversely in one direction, and the second portion 26 of the vibrator portion 21 is also polarized transversely but in the direction opposite to that of the polarization in the first portion 24 of the vibrator portion 21.

In order that electrical voltages may be related to mechanical stress in the slab 20, electrodes are provided. If desired, there may be a common electrode 28, shown as grounded. For the primary connection and for relating voltages at opposite faces of the low impedance vibrator portion 21 of the slab 20, there is an electrode 30 opposite the common electrode 28. For relating voltages to stresses generated in the longitudinal direction in the high impedance generator portion 22 of the slab 20, there is a secondary or high-voltage electrode 35 on the end of the slab for cooperating with the common electrode 28. The electrode 35 is shown as connected to a terminal 34 of an output load 36 grounded at its opposite end.

In the arrangement illustrated in FIG. 1, a voltage applied between the electrodes 28 and 30 of the low impedance vibrator portion 21 is stepped up to a higher voltage between the electrodes 28 and 35 in the high impedance generator portion for supplying the load 36 at a much higher voltage than that applied between the electrodes 28 and 30. The applied voltage causes a deformation of the slab through proportionate changes in the x-y and y-z surface areas. More specifically, the Rosen PT is operated by applying alternating voltage to the drive electrodes 28 and 30, respectively. A longitudinal vibration is thereby excited in the low impedance vibrator portion 21 in the transverse effect mode ("d31 mode"). The transverse effect mode vibration in the low impedance vibrator portion 21 in turn excites a vibration in the high impedance generator portion 22 in a longitudinal effect longitudinal vibration mode ("g33 mode"). As the result, high voltage output is obtained between electrode 28 and 35. On the other hand, for obtaining output of step-down voltage, as appreciated, the high impedance portion 22 undergoing longitudinal effect mode vibration may be used as the input and the low impedance portion 21 subjected to transverse effect mode vibration as the output.

The Rosen type PT has been found disadvantageous in that the only useable coupling coefficient is k31, which is associated with the very small transverse effect longitudinal vibration mode ("d31 mode"). This results in obtaining only a very small bandwidth. Conventional piezoelectric transformers like this operate only up to about 200 kHz.

Another inherent problem of such prior PTs is that they have relatively low power transmission capacity. This disadvantage of prior PTs relates to the fact that little or no mechanical advantage is realized between the vibrator portion 21 of the device and the driver portion 22 of the device, since each is intrinsically a portion of the same electroactive member. This inherently restricts the mechanical energy transmission capability of the device, which, in turn, inherently restricts the electrical power handling capacity of such devices.

Additionally, even under resonant conditions, because the piezoelectric voltage transmission function of Rosen-type PTs is accomplished by proportionate changes in the x-y and y-z surface areas (or, in certain embodiments, changes in the x-y and x'-y' surface areas) of the piezoelectric member, which changes are of relatively low magnitude, the power handling capacity of prior circuits using such piezoelectric transformers is inherently low.

In addition, with the typical Rosen transformer, it is generally necessary to alternately apply positive and negative voltages across opposing faces of the vibrator portion 21 of the member in order to "push" and "pull", respectively, the member into the desired shape.

Even under resonant conditions, prior electrical circuits that incorporate such prior PTs are relatively inefficient, because the energy required during the first half-cycle of operation to "push" the piezoelectric member into a first shape is largely lost (i.e. by generating heat) during the "pull" half-cycle of operation. This heat generation corresponds to a lowering of efficiency of the circuit, an increased fire hazard, and/or a reduction in component and circuit reliability.

Furthermore, in order to reduce the temperature of such heat generating circuits, the circuit components (typically including switching transistors and other components, as well as the transformer itself) are oversized, which reduces the number of applications in which the circuit can be utilized, and which also increases the cost/price of the circuit.

Because the power transmission capacity of such prior PTs is so low, it has become common in the prior art to combine several such transformers together into a multi-layer "stack" in order to achieve a greater power transmission capacity than would be achievable using one such prior transformer alone. This, of course, increases both the size and the manufacturing cost of the transformer.

Also generally known are PTs polarized and vibrating in the thickness direction (i.e., vibrations are parallel to the direction of polarization of the layers). Illustrative of such "thickness mode" vibration PTs is the device of U.S. Pat. No. 5,118,982 to Inoue shown in FIG. 3. A thickness mode vibration PT typically comprises a low impedance portion 11 and a high impedance portion 12 stacked on each other. The low impedance portion 11 and the high impedance portion 12 of the thickness mode PT typically comprises a series of laminate layers of ceramic alternating with electrode layers. Each portion is composed of at least two electrode layers and at least one piezoelectric material layer. Each of the piezoelectric ceramic layers of the low impedance portion 11 and the ceramic layer of the high impedance portion 12 are polarized in the thickness direction (perpendicular to the plane of the interface between the ceramic layers). Every alternate electrode layer in each portion 11 or 12 may be connected to each other and to selected external terminals.

The thickness mode PT of FIG. 3 comprises a low impedance vibrator portion 11 including a plurality of piezoelectric layers 111 through 114 and a high impedance vibrator portion 12 including a piezoelectric layer 122, each of the layers being integrally laminated, as shown in FIG. 4, and caused to vibrate in thickness-extensional mode.

The low impedance portion 11 has a laminated structure which comprises multi-layered piezoelectric layers ill through 114 each being interposed between electrodes including the top surface electrode layer 204 and internal electrode layers 131 through 134. The high impedance portion 12 is constructed of the bottom electrode layer 202, an internal electrode layer 134 and a single piezoelectric layer 122 interposed between both electrode layers 202 and 134. Polarization in each piezoelectric layer is, as indicated by arrows, in the direction of thickness, respectively. In the low impedance portion 11, alternating piezoelectric layers are polarized in opposite directions to each other. The polarization in the high impedance portion 12 is also in the direction of thickness.

When an alternating voltage is applied to the electrode layers across the ceramic layer of the vibrator portion 11, a vibration is excited in the ceramic parallel to the direction of the polarization of the layers in the longitudinal vibration mode ("d33 mode"). This vibration of the low impedance portion 11 excites a vibration in the high impedance portion 12. As the high impedance portion 12 vibrates, the g33 mode deformation of the high impedance portion 12 generates an electrical voltage across the electrodes of the high impedance portion 12. When operating the PT in the thickness-extensional mode with a resonance of lambda/2 mode or lambda mode the PT may operate in a frequency range of 1–10 MHz, depending on the PT's thickness.

A problem with prior thickness mode PTs is that the thickness mode resonant frequency is too high for some applications.

Another problem with prior thickness mode PTs is that they do not have a sufficient power transmission capacity for some applications.

Another problem with prior thickness mode PTs is that the addition of ceramic layers to the PT does not significantly raise the power density of such devices and may increase capacitive and dielectric losses.

Accordingly, it would be desirable to provide a piezoelectric transformer design that has a higher power transmission capacity than similarly sized prior piezoelectric transformers.

It would also be desirable to provide a piezoelectric transformer that is smaller than prior piezoelectric transformers that have similar power transmission capacities.

It would also be desirable to provide a piezoelectric transformer in which the "driver" portion of the device and the "driven" portion of the device are not the same electro-active element.

It would also be desirable to provide a piezoelectric transformer that develops a substantial mechanical advantage between the driver portion of the device and the driven portion of the device.

It would also be desirable to provide a piezoelectric transformer that, at its natural frequency, oscillates with greater momentum than is achievable with comparably sized prior piezoelectric transformers.

It would also be desirable to provide a piezoelectric transformer that develops a greater voltage across the output layer of a similar sized device.

It would also be desirable to provide a piezoelectric transformer that provides electrical isolation between the input and output portions of the transformer.

SUMMARY OF THE INVENTION

According to the present invention, there is provided a piezoelectric transformer (PT) preferably operating at its natural (i.e. "resonant") frequency to convert a transformer input signal of a first character (i.e. voltage, frequency and current) to a transformer output signal of a second character (i.e. voltage, frequency and current). The disclosed PT efficiently accomplishes the described signal conversion by subjecting the input "driver" section of the PT to an alternating voltage (or in certain embodiments a pulsed voltage) which causes the input portion(s) to deform and vibrate, which in turn causes the output portion(s) to vibrate, which in turn causes the "driven" output portion(s) of the PT to deform, and which in turn generates an output voltage at the driven section of the transformer.

The preferred embodiment of the invention provides a multi-layer piezoelectric transformer PT. The PT has an input PZT layer which is bonded to an insulation layer on one of its major faces. The input layer is electroded on both major faces and is poled between the electrodes perpendicular to the input layer's major faces (in the thickness direction). Application of an alternating voltage causes the input layer to expand and contract depending on the polarity of the voltage.

The output layer of the PT comprises another layer of PZT bonded along a major face to the other side of the insulator layer. The output layer has segmented electrodes patterned on its two opposing major faces. Adjacent portions of the output layer are alternatingly poled in opposite directions perpendicular to the major faces of the output layer between respective electrode segments. The configuration of the poling and electrodes places adjacent portions of the output layer electrically in series. A longitudinal deformation of the input layer causes a longitudinal deformation of the output layer, which generates the output voltage across the output electrodes.

Accordingly, it is an object the present invention to provide a PT design that has a higher power transmission capacity than similarly sized prior PTs.

It is another object of the present invention to provide a PT of the character described that has a smaller size and a lower profile than prior PTs that have similar power transmission capacities.

It is another object of the present invention to provide a PT of the character described in which the "driver" portion of the device and the "driven" portion of the device are not the same electro-active element.

It is another object of the present invention to provide a PT of the character described that develops a substantial mechanical advantage between the driver portion of the device and the driven portion of the device.

It is another object of the present invention to provide a PT of the character described that is relatively less expensive to manufacture than prior PTs that perform comparable signal transformation functions.

It is another object of the present invention to provide a PT of the character described and that is simpler to manufacture than prior PTs having a laminate structure.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DESCRIPTION OF THE PREFERRED EMBODIMENT

In the present invention, a multi-layer piezoelectric transformer is provided using the longitudinal mode resonant vibrations for step-up voltage conversion applications. Typical PTs utilize a multi-layer construction in attempting to provide greater voltage gain and power to circuit applications. The transformation ratio is typically substantially proportional to the square of impedance ratio between the input and output portions. In view of this, attempts have been made in prior PTs to increase gain by making the output layer thicker. There is however a practical limit to the efficacy of adding ceramic layers and after a certain point, additional layers do not contribute to the gain of the PT. Furthermore, added layers may bring the ratio between the thickness dimension and the longitudinal or radial dimension too close to unity, thereby creating interference between the radial and thickness mode resonant frequencies.

Therefore, a high voltage PT is provided which has high voltage output while still providing a low profile device. A low profile device is necessary because as the ratio of the thickness to the diameter or length of a PT approaches unity, the planar or radial resonance mode and the thickness resonant mode vibrations interfere with each other. The present configuration of PT minimizes the interference of resonant modes with the following design. The present PT also provides a greater gain and thus greater output voltage than similarly sized prior PTs through a unique configuration in poling and in the pattering of electrodes on the PT.

Figure 1:
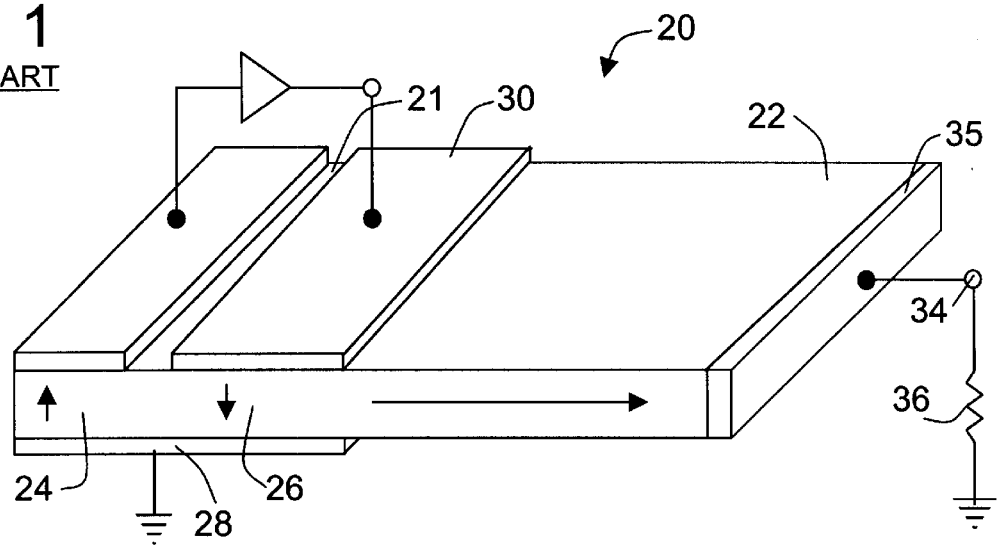
FIG. 1 is a partially schematic perspective view of a typical Rosen type piezoelectric transformer of the prior art.
Figure 2:
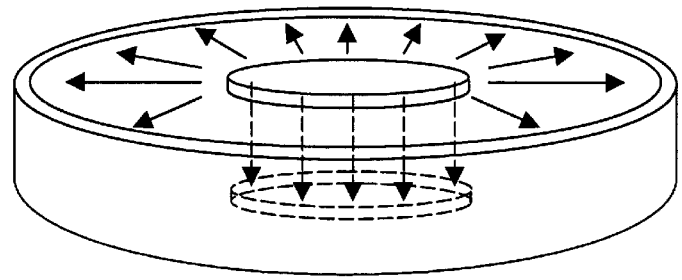
FIG. 2 is a perspective view of another example of a Rosen type piezoelectric transformer of the prior art.
Figure 3:
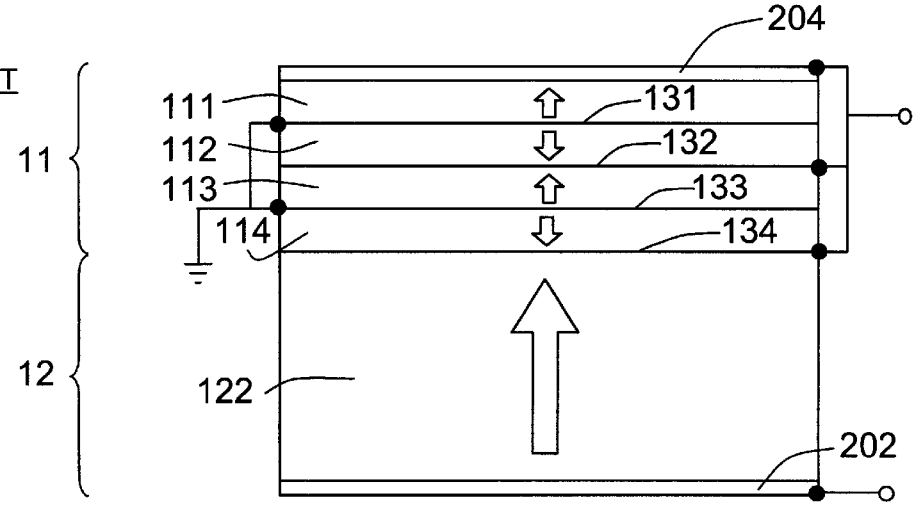
FIG. 3 is a perspective view of a typical multi-layer thickness mode vibration piezoelectric transformer of the prior art.
Figure 4:
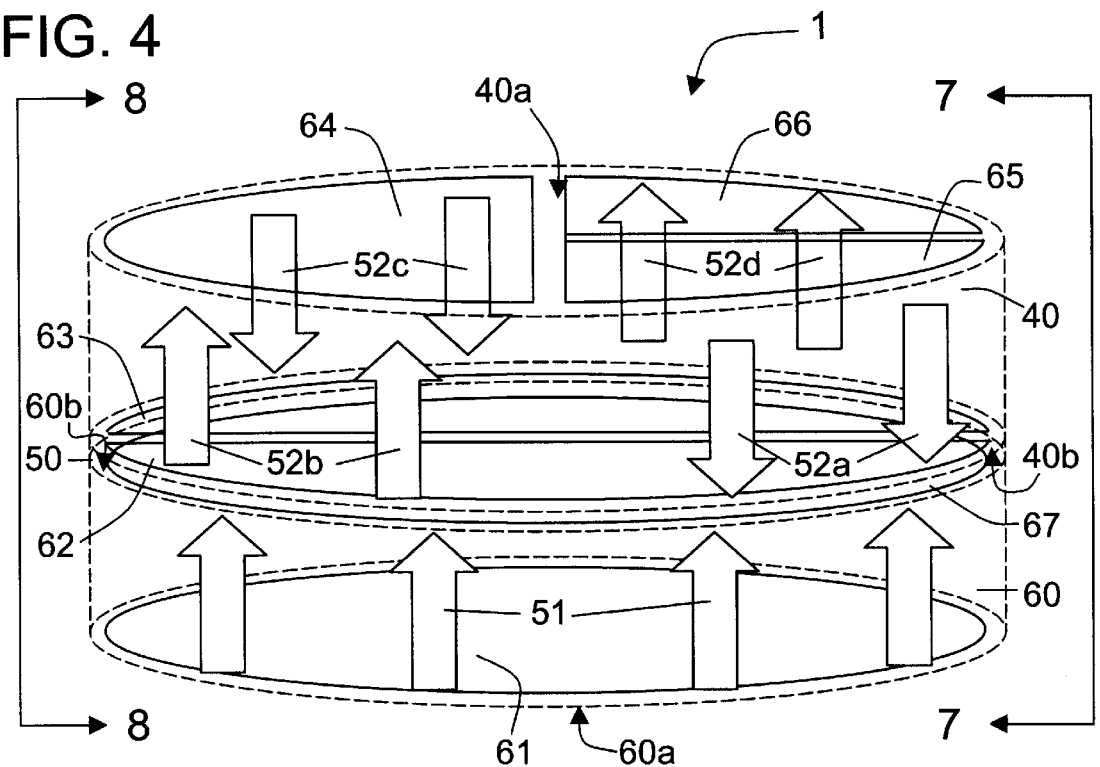
FIG. 4 is a perspective view of the preferred embodiment of the piezoelectric transformer of the present invention.
Figure 5:
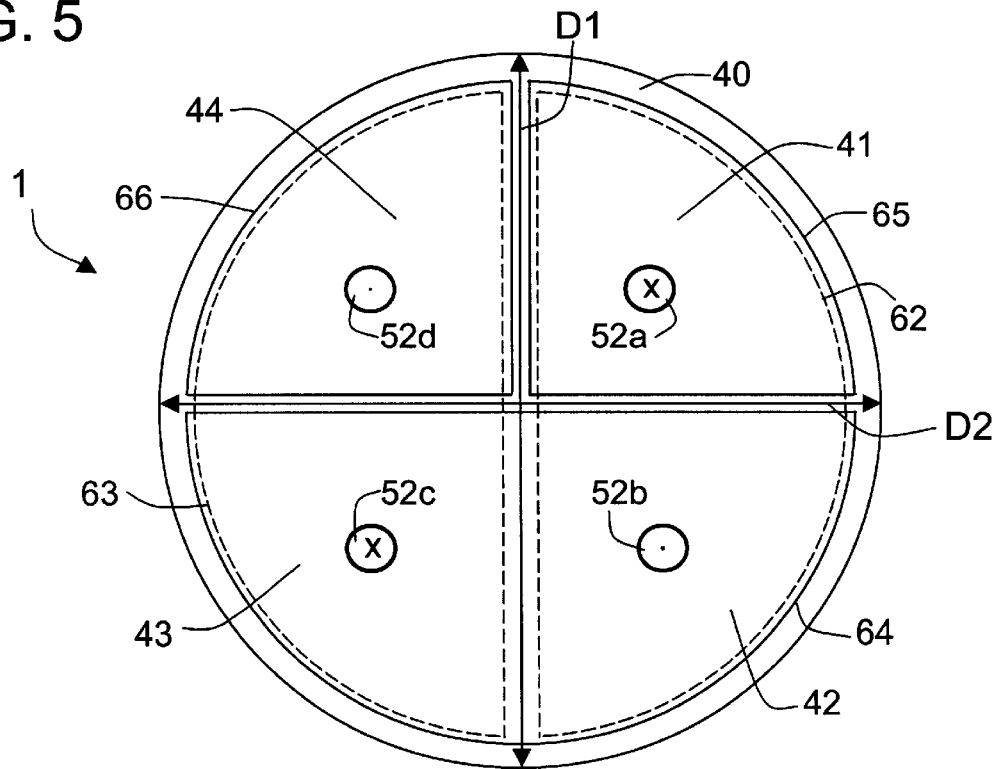
FIG. 5 is a plan view of the piezoelectric transformer of FIG. 4 showing the directions of polarization of the output layer.
Figure 6:
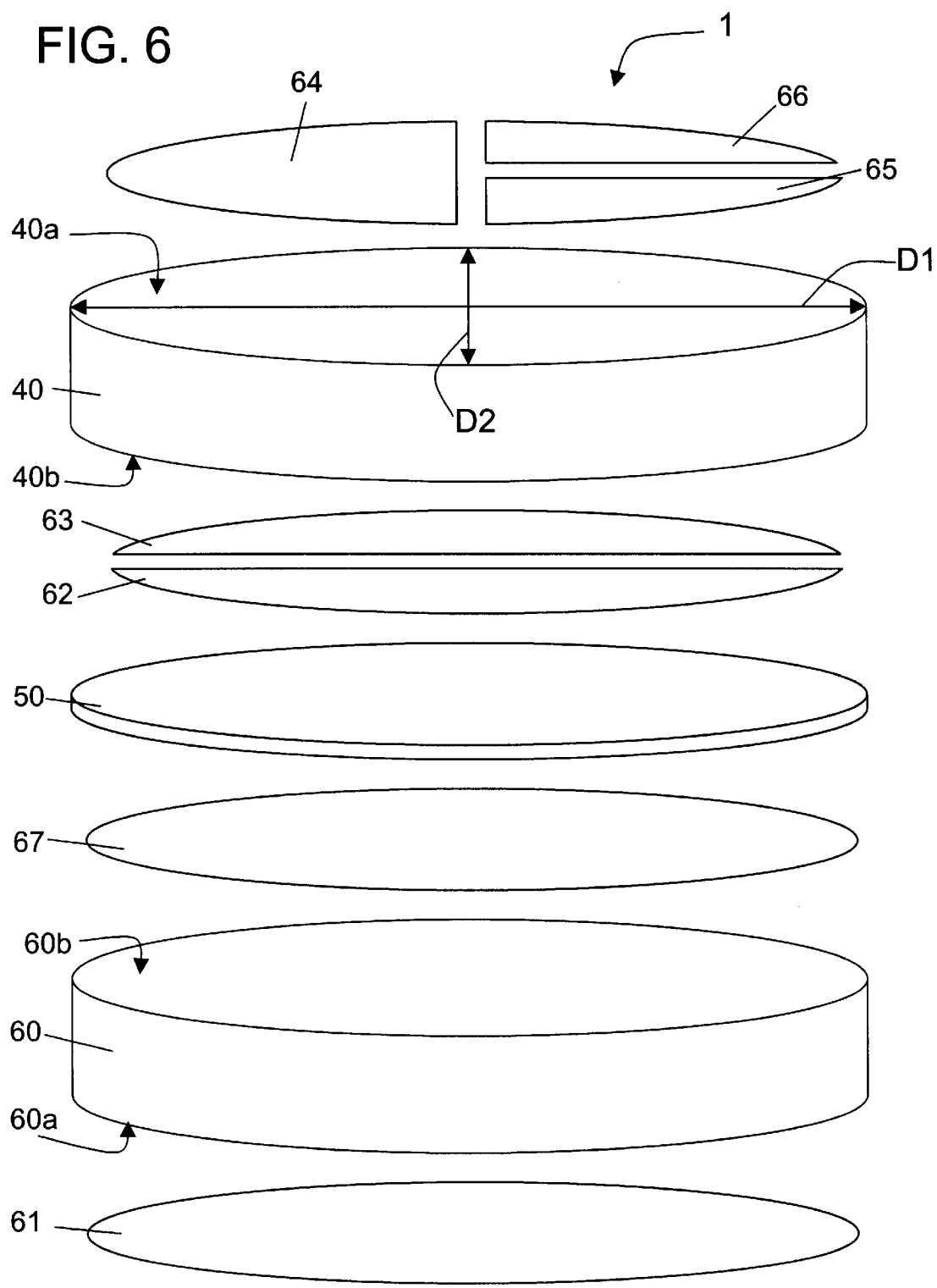
FIG. 6 is a blown up perspective view of the piezoelectric transformer of FIG. 4 showing the details of its construction.
Figure 7:
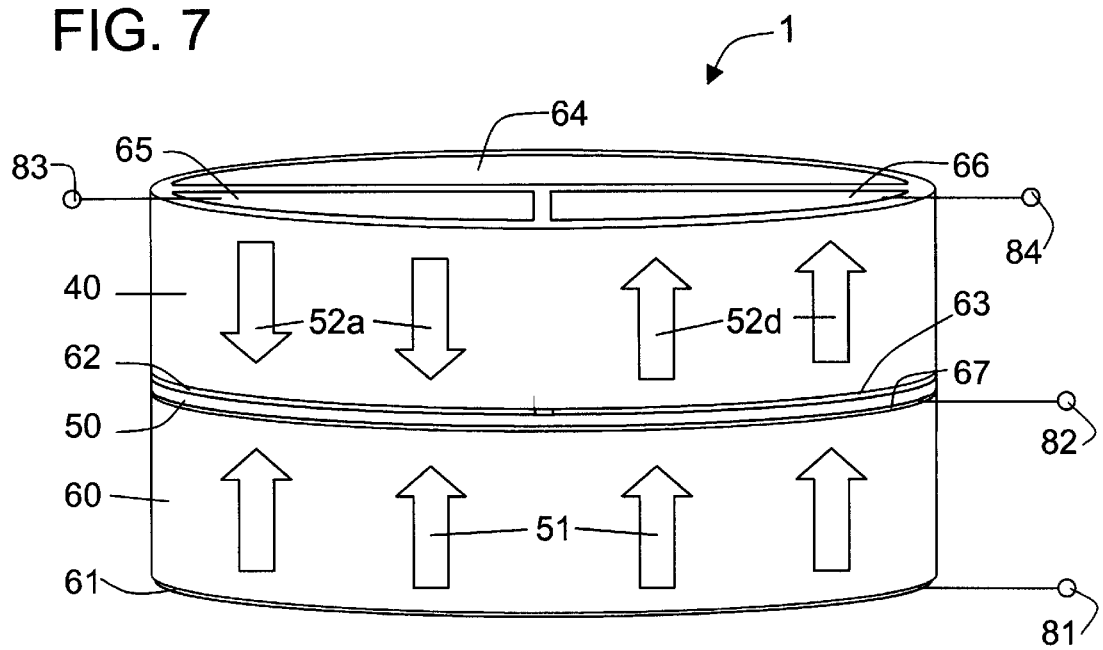
FIG. 7 is a perspective view along line 7—7 of FIG. 4 showing the polarization of the layers.
Figure 8:
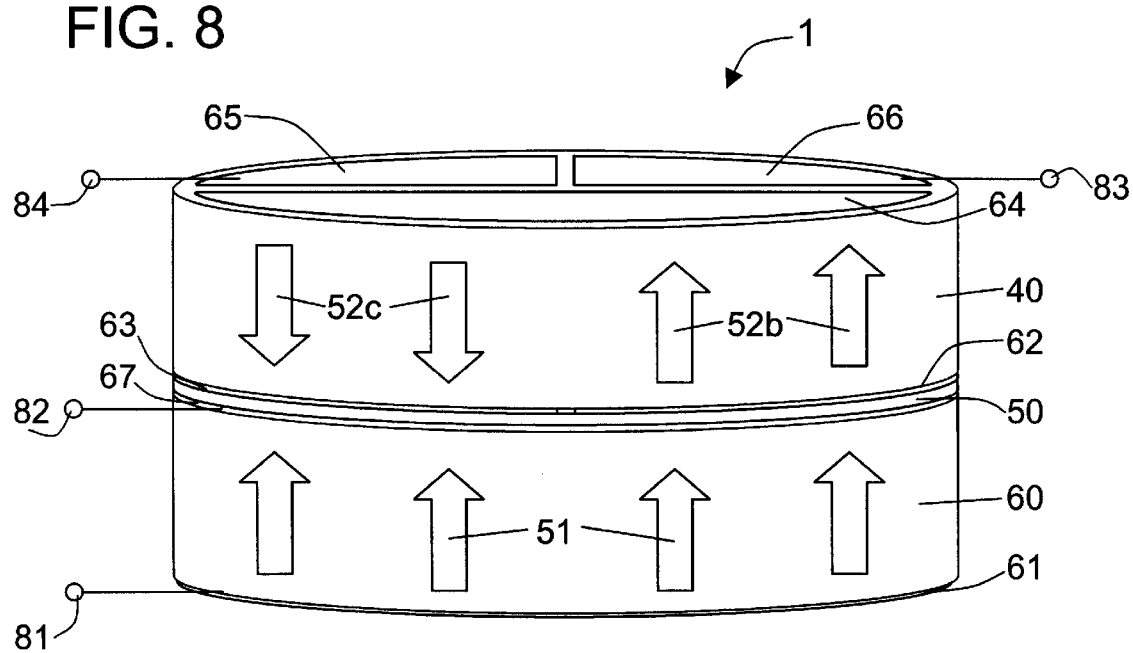
FIG. 8 is a perspective view along line 8—8 of FIG. 4 showing the polarization of the layers.

Referring now to FIG. 4: In the preferred embodiment of the invention, the PT 1 comprises an input layer 60 comprising a thin layer of an electroactive material, preferably PZT with electrodes (silver and/or nickel) deposited thereon. Preferably, the input layer 60 is circular in order to take advantage of the resonant frequency in the radial mode vibration. However, the input layer 60 may alternatively be rectangular or bar-shaped in order to use the longitudinal or planar mode of vibration. Alternatively, the thickness mode vibration may be used in either the circular or the rectangular configuration. Electrodes are provided on the two major faces of the input layer. More specifically, a first input electrode is bonded to a first face of the input ceramic layer and substantially covers the first face. A second input electrode is bonded to the second face of the input ceramic layer and substantially covers the second face.

In the preferred embodiment of the invention, the input layer 60 is a disk shaped mass of PZT and the first input electrode 61 comprises a circular electrode substantially covering the face 60a of the ceramic layer 60. The second input electrode 67 also comprises a circular electrode substantially covering the second face 60b of the ceramic layer 60. Each of the input electrodes 61 and 67 is preferably bonded to its respective face 60a and 60b of the input layer 60 by electro-deposition, but may also be applied by screen printing, vapor deposition, cofiring or other conventional process. Each electrode 61 and 67 preferably has a terminal 81 and 82 comprising a copper foil bonded to and substantially covering them to provide a surface upon which to solder electrical leads. Bonding of the copper foil terminal 81 and 82 to the input layer 60 and the electrodes 61 and 67 is preferably achieved using "Ciba-Geigy AV118" (CIBA) as manufactured by Ciba Specialty Chemicals Corporation, N.A. of East Lansing, Mich.

The input layer 60 is polarized in the thickness direction, i.e., in a direction perpendicular to the electrodes 61 and 67 on the major faces 60a and 60b of the input layer 60 as indicated by arrows 51. Preferably, the entirety of the input ceramic layer 60 is polarized in one direction, i.e., the direction of poling between input electrodes 61 and 67 is in the same throughout the layer 60. The polarization of the input layer 60 is such that when a voltage is applied across the input electrodes 61 and 67, the input layer 60 deforms in the longitudinal direction, i.e., a planar or radial mode deformation in a direction parallel to the planes of electrodes 61 and 67.

The PT also comprises an insulator layer 50. The insulator layer 50 preferably comprises an insulator material which has a similar coefficient of expansion as the parts of the PT 1 to which it is bonded such as ceramic, alumina, mica, or KAPTON film as manufactured by E. I. du Pont de Nemours and Company of Wilmington, Del. The insulator layer 50 is bonded to the second face of the input layer 60 and the second input electrode 67, as well as the terminal 82 thereon. The insulator layer 50 extends at least across the area of the second input electrode 67, and most preferably extends across and is bonded to the complete face 60b of the input layer 60. The insulator layer 50 prevents the input electrode 67 from contacting the electrodes of the output layer described herein below. Bonding of the insulator layer 50 to the input layer 60 and input electrode 67 is preferably achieved using "Ciba-Geigy AV118" (CIBA) as manufactured by Ciba Specialty Chemicals Corporation, N.A. of East Lansing, Mich.

The PT 1 also comprises an output layer intimately bonded to the insulator layer. The output layer of the PT comprises another thin layer of an electroactive material, preferably PZT with electrodes (silver and/or nickel) deposited thereon. Preferably, the output layer is also circular in order to take advantage of the resonant frequency in the radial mode vibration. However, the output layer may alternatively be square, rectangular or bar-shaped in order to use the longitudinal or planar mode of vibration. Alternatively, the thickness mode resonant frequency may be used with either a circular or a rectangular configuration.

The output layer has output electrodes and intermediate electrodes bonded to opposing faces of the output layer. More specifically, output electrodes are bonded to a first face of the output ceramic layer, substantially covering the first face. The two intermediate electrodes are bonded to the second face of the output ceramic layer and in combination substantially cover the second face. Each of the intermediate and output electrodes is preferably bonded to its respective face of the output layer by electro-deposition, but may also be applied by screen printing, vapor deposition, cofiring or other conventional process.

In the preferred embodiment of the invention, the output layer 40 is also a disk shaped mass of PZT having two faces 40a and 40b. The second face 40b of the output layer 40, including the electrodes thereon, is bonded to the insulator layer 50 and thereby indirectly to the second face 60b of the input layer 60. The output layer also comprises the two intermediate electrodes 62 and 63 on the second face 40b of the output layer 40. The intermediate electrodes 62 and 63 bonded to the second face 40b preferably comprise semicircular electrodes that are electrically isolated from each other. The semicircular electrodes 62 and 63 are arranged in a non-overlapping manner such that each of them is on the opposite side a diameter D1 of the second face 40b of the output ceramic layer 40. In other words, in combination the semicircular electrodes 62 and 63 substantially cover the second face 40b of the output ceramic layer 40, with the exception of a thin strip of nonelectroded ceramic in the middle of the face 40b along diameter D1. Each of the intermediate electrodes 62 and 63 is preferably bonded to the face 40b of the output layer 40 by electro-deposition, but may also be applied by screen printing, vapor deposition, cofiring or other similar process.

Output electrodes 64, 65 and 66 are bonded to a first face 40a of the output ceramic layer 40, substantially covering the face 40a. The output electrodes preferably comprise a semicircular electrode 64 and two quarter electrodes 65 and 66 that are electrically isolated from each other. The semicircular electrode 64 and two quarter electrodes 65 and 66 are arranged in a non-overlapping manner such that the semicircular electrode 64 is on one side of a second diameter D2 of the first face 40a and the two quarter electrodes 65 and 66 are on the opposite side of the diameter D2 of the first face 40a of the output ceramic layer 40. Preferably the first diameter D1 and the second diameter D2 are at 90 degree angles to each other. The two quarter electrodes 65 and 66 are not only electrically isolated from the semicircular electrode 64, but are also electrically isolated from each other, being located on opposite sides of the first diameter D1 on the remaining semicircular portion of the first face 40a of the ceramic layer 40. In other words, in combination the semicircular electrode 64 and two quarter electrodes 65 and 66 substantially cover the first face 40a of the output ceramic layer 40, with the exception of a first thin strip of nonelectroded ceramic in the middle of the face 40a (along diameter D2) between the semicircular electrode 64 and the quarter electrodes 65 and 66, and another thin strip of nonelectroded ceramic bisecting the semicircle between the quarter electrodes 65 and 66 (along diameter D1). Each of the output electrodes 64, 65 and 66 is preferably bonded to the face 40a of the output layer 40 by electro-deposition, but may also be applied by screen printing, vapor deposition, cofiring or other similar process.

The electrodes upon which electrical leads are to be attached are preferably the quarter output electrodes 65 and 66. Each electrode 65 and 66 preferably has a terminal 83 and 84 comprising a copper foil bonded to and substantially covering it to provide a surface upon which to solder electrical leads and to prevent damage to the electrode 65 and 66 beneath it. Bonding of the copper foil to the electrodes of the output layer is preferably achieved using "Ciba-Geigy AV118" (CIBA) as manufactured by Ciba Specialty Chemicals Corporation, N.A. of East Lansing, Mich. In an alternate embodiment an additional output terminal comprising a copper foil may be bonded to and substantially cover semicircular output electrode 64 in order to provide a center-tapped output terminal.

As can be seen in FIGS. 4 through 8, each face 40a and 40b of the output layer 40 has electrodes thereon which are in opposing relation with the one or more electrodes on the opposite face 40a or 40b. The semicircular output electrode 64 is on one side of diameter D2, and the intermediate electrodes 62 and 63 are on opposite sides of diameter D1, where the two diameters D1 and D2 are perpendicular to each other. Also, the two quarter output electrodes 65 and 66 are on the other side of diameter D2. Thus, the electrodes on opposing faces 40a and 40b and on one side of diameter D2 are the semicircular output electrode 64 and half of each of the intermediate electrodes 62 and 63. The electrodes on opposing faces 40a and 40b and on the opposite side of diameter D2 are the two quarter electrodes 65 and 66 and the remaining half of each of the intermediate electrodes 62 and 63.

In other words, the two perpendicular diameters D1 and D2 essentially define four quadrants 41, 42, 43 and 44 of the output layer 40. On opposing faces 40a and 40b of the first quadrant 41 are quarter electrode 65 and half of intermediate electrode 62. On opposing faces 40a and 40b of the second quadrant 42 are half of semicircular output electrode 64 and the other half of intermediate electrode 62. On opposing faces 40a and 40b of the third quadrant 43 are the other half of semicircular output electrode 64 and half of intermediate electrode 63. Lastly, on opposing faces 40a and 40b of the fourth quadrant 44 are quarter electrode 66 and the other half of intermediate electrode 63.

The output layer 40 is polarized in the thickness direction, i.e., in the direction(s) perpendicular to the intermediate electrodes 62 and 63 and output electrodes 64, 65 and 66 on the major faces 40a and 40b of the output layer 40 as indicated by arrows 52a–d. This polarization is such that when a voltage is applied across an output electrode 64, 65 or 66 and an intermediate electrode 62 or 63, the portion of the output layer 40 between the two electrodes will deform in the longitudinal direction, i.e., a planar or radial mode deformation in a direction parallel to the planes of electrodes 62 and 63, and 64, 65 and 66. More specifically, that quadrant 41, 42, 43 or 44 of the output layer 40 between the selected electrodes 62 or 63, and 64, 65 or 66 will deform. Conversely, a deformation of the output layer 40 will generate a voltage (in the planar or radial mode) between the intermediate and output electrodes 62 and 63, and 64, 65 and 66. More specifically, a deformation of a quadrant 41, 42, 43 or 44, will generate a voltage across the electrodes 62 and 63, and 64, 65 and 66 on the respective faces 40a and 40b of each quadrant 41, 42, 43 or 44.

The output layer 40 is preferably polarized in a manner that places the quadrants 41, 42, 43 and 44 electrically in series with each other. More specifically, the direction of polarization of quadrants 41 and 43 (indicated by arrows 52a and 52c) is opposite to the direction of the polarization of quadrants 42 and 44 (indicated by arrows 52b and 52d). Because of the relative orientation of the polarization of the quadrants 41, 42, 43 and 44 to the intermediate electrodes 62 and 63 and the output electrodes 64, 65 and 66, the voltages generated in each quadrant 41, 42, 43 and 44 are placed electrically in series.

In operation, an input voltage may be applied to input terminals 81 and 82 connected to the input electrodes 61 and 67 respectively. When a voltage of a first polarity is applied across the input electrodes 61 and 67 on the faces 60a and 60b of the input layer 60, the input layer 60 deforms radially expanding. Because the input layer 60 is firmly bonded to the insulator layer 50 and indirectly to the output layer 40, the output layer 40 also expands. The expansion of the output layer 40 piezoelectrically generates a voltage across the intermediate electrodes 62 and 63 and the output electrodes 64, 65 and 66. More specifically, the expansion of the first quadrant 41 generates a voltage of the first polarity across electrodes 65 and 62 and the expansion of the second quadrant 42 generates a voltage of a second opposite polarity across electrodes 64 and 62. The expansion of the third quadrant 43 generates a voltage of the first polarity across electrodes 64 and 63 and the expansion of the fourth quadrant 44 generates a voltage of the second polarity across electrodes 63 and 66. The output voltage which is the sum of all the voltages developed in the four quadrants 41, 42, 43 and 44 may be taken across terminals 83 and 84 connected to output electrodes 65 and 66 respectively.

When a voltage of the second opposite polarity is applied across the input electrodes 61 and 67 on the faces 60a and 60b of the input layer 60, the input layer 60 deforms radially contracting. Because the input layer 60 is firmly bonded to the insulator layer and indirectly to the output layer 40, the output layer 40 also contracts. The contraction of the output layer 40 piezoelectrically generates a voltage across the intermediate electrodes 62 and 63 and the output electrodes 64, 65 and 66. More specifically, the contraction of the first quadrant 41 generates a voltage of the second polarity across electrodes 65 and 62 and the contraction of the second quadrant 42 generates a voltage of the first polarity across electrodes 64 and 62. The contraction of the third quadrant 43 generates a voltage of the second polarity across electrodes 64 and 63 and the contraction of the fourth quadrant 44 generates a voltage of the first polarity across electrodes 63 and 66. The output voltage, which is the sum of all the voltages developed in the four quadrants 41, 42, 43 and 44, may be taken across terminals 83 and 84 connected to output electrodes 65 and 66 respectively.

The intermediate electrodes 62 and 63 and the output electrodes 64, 65 and 66 are configured so as to place the potentials across each quadrant 41, 42, 43 and 44 electrically in series. Intermediate electrode 62 electrically connects the first and second quadrants 41 and 42 in series. Likewise, semicircular output electrode 64 electrically connects the second and third quadrants 42 and 43 in series, and intermediate electrode 63 electrically connects the third and fourth quadrants 43 and 44 in series. Thus, the potentials in each quadrant 41, 42, 43 and 44 are electrically in series and their sum may be taken across the two quarter output electrodes 65 and 66.

Figure 9:
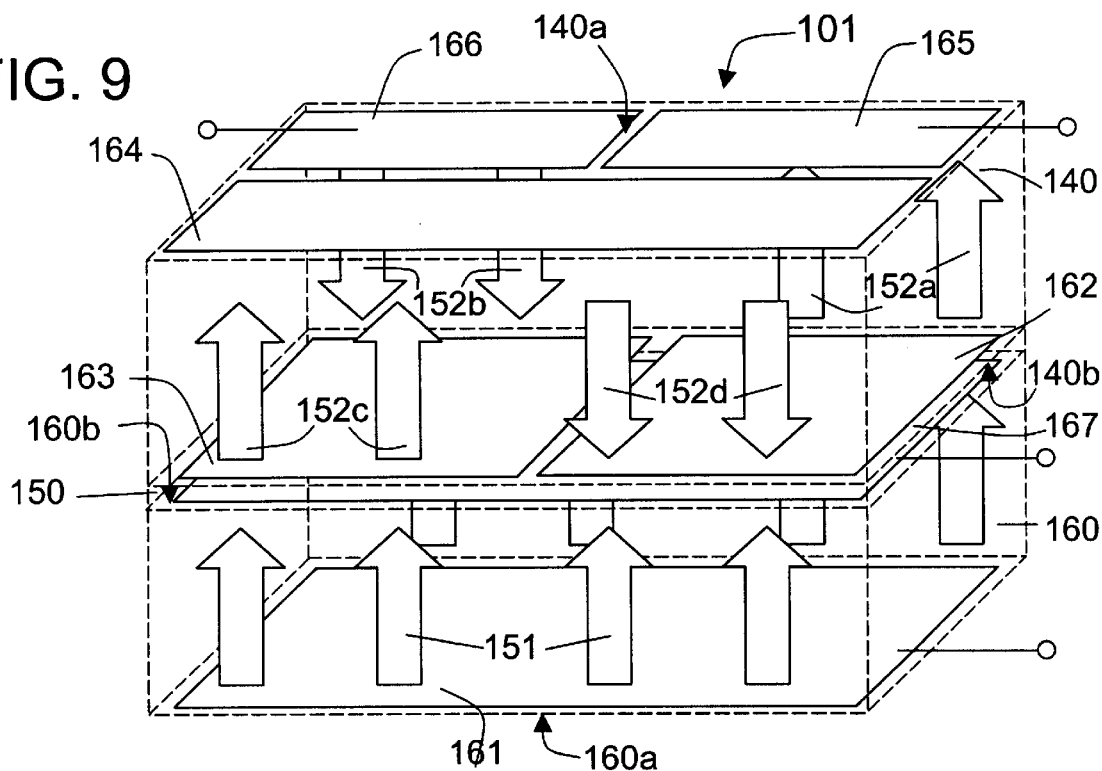
FIG. 9 is a perspective view of an alternate embodiment of the piezoelectric transformer of the present invention.
Figure 10:
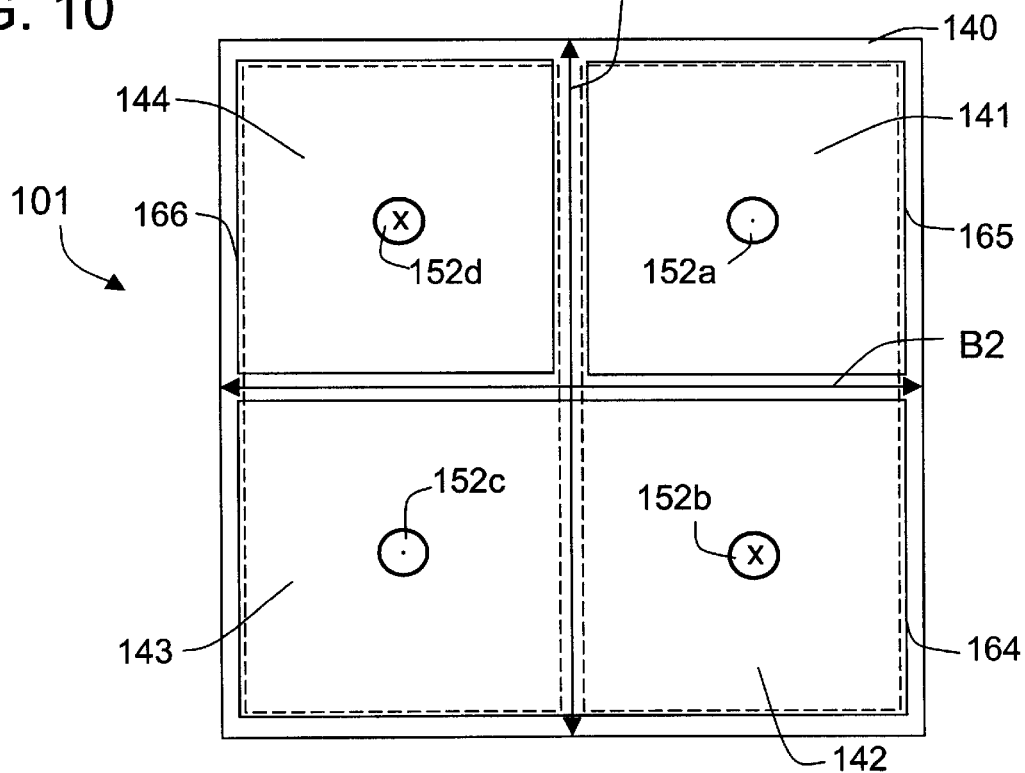
FIG. 10 is a plan view of the piezoelectric transformer of FIG. 9 showing the polarization directions of the output layer.

Referring now to FIGS. 9 and 10: In an alternate embodiment of the invention, the transformer 101 comprises an input layer 160 that is a square or rectangularly shaped mass of PZT. The input electrodes 161 and 167 each comprise a square or rectangular electrode substantially covering the faces 160a and 160b of the ceramic layer 160 respectively. Each of the input electrodes 161 and 167 is preferably bonded to its respective face of the input layer 160 by electro-deposition, but may also be applied by screen printing, vapor deposition, cofiring or other conventional process. The electrodes 161 and 167 preferably each have terminals 181 and 182 respectively, comprising a copper foil bonded to and substantially covering them to provide a surface upon which to solder electrical leads. Bonding of the copper foil to the input layer 160 and the electrodes 161 and 167 is preferably achieved using "Ciba-Geigy AV118" (CIBA) as manufactured by Ciba Specialty Chemicals Corporation, N.A. of East Lansing, Mich.

The input layer 160 is polarized in the thickness direction, i.e., in a direction perpendicular to the electrodes 161 and 167 on the major faces 160a and 160b of the input layer 160 as indicated by arrows 151. Preferably, the entirety of the input ceramic layer 160 is polarized in one direction, i.e., the direction of poling between input electrodes 161 and 167 is consistent throughout the input ceramic layer 161. The polarization of the input layer 160 is such that when a voltage is applied across the input electrodes 161 and 167, the input layer 160 deforms in the longitudinal direction, i.e., a planar mode deformation in a direction parallel to the planes of electrodes 161 and 167.

In the alternate embodiment of the invention, the PT 101 also comprises an insulator layer 150. The insulator layer 150 preferably comprises an insulator material which has a similar coefficient of expansion as the parts of the PT 101 to which it is bonded such as ceramic, alumina, mica, or KAPTON film as manufactured by E. I. du Pont de Nemours and Company of Wilmington, Del. The insulator layer 150 is bonded to the second face 160*b* of the input layer 160 and the second input electrode 167 as well as the terminal 182 thereon. The insulator layer 150 extends at least across the area of the second input electrode 167, and most preferably extends across and is bonded to the complete face 160*b* of the input layer 160. The insulator layer 150 prevents the input electrode 167 from contacting the electrodes of the output layer described herein below. Bonding of the insulator layer 150 to the input layer 160 and input electrode 167 is preferably achieved using "Ciba-Geigy AV118" (CIBA) as manufactured by Ciba Specialty Chemicals Corporation, N.A. of East Lansing, Mich.

The PT 101 also comprises an output layer 140 comprising a square or rectangularly shaped mass of PZT having two faces 140*a* and 140*b*, with the second face 140*b* intimately bonded to the insulator layer 150. Bonding of the insulator layer 150 to the output layer 140 is preferably achieved using "Ciba-Geigy AV118" (CIBA) as manufactured by Ciba Specialty Chemicals Corporation, N.A. of East Lansing, Mich. Because the second face 140*b* of the output layer 140 is bonded to the insulator layer 150, it is also bonded indirectly the second face 160*b* of the input layer 160. The output layer 140 also comprises two intermediate electrodes 162 and 163. The intermediate electrodes 162 and 163 preferably comprise rectangular electrodes that are electrically isolated from each other. The rectangular electrodes 162 and 163 are bonded to the second face 140*b* of the output layer 140 and are arranged in a non-overlapping manner such that each of them is on opposite sides a bisector B1 of the second face 140*b* of the output ceramic layer 140. In other words, in combination the rectangular electrodes 162 and 163 substantially cover the second face 140*b* of the output ceramic layer 140, with the exception of a thin strip of nonelectroded ceramic in the middle of the face 140*b* along bisector B1. Each of the intermediate electrodes 162 and 163 is preferably bonded to the face 140*b* of the output layer 140 by electro-deposition, but may also be applied by screen printing, vapor deposition, cofiring or other similar process.

The output electrodes 164, 165 and 166 are bonded to a first face 140*a* of the output ceramic layer 140, substantially covering the face 140*a*. The output electrodes preferably comprise one larger rectangular electrode 164 substantially covering one half of the face 140*a* (half electrode) and two smaller rectangular electrodes 65 and 66 (quarter electrodes) each substantially covering one quarter of the face 140*b* of the output layer 140. The half electrode 164 and two smaller quarter electrodes 165 and 166 are electrically isolated from each other, i.e., arranged in a non-overlapping manner. Thus, the electrodes are arranged such that the half electrode 164 covers one half of the face 140*a* on one side of a second bisector B2 of the first face 140*a* and the two smaller quarter electrodes 165 and 166 substantially cover the first face 140*a* on the opposite side of the bisector B2. The two quarter electrodes 165 and 166 are not only electrically isolated from the half electrode 164, but are also electrically isolated from each other, being located on opposite sides of bisector B1 of the remaining half portion of the first face 140*a* of the ceramic layer 140 not covered by the half electrode 164. In other words, in combination the half electrode 164 and two quarter electrodes 165 and 166 substantially cover the first face 140*a* of the output ceramic layer 140, with the exception of a first thin strip of nonelectroded ceramic in the middle of the face 140*a* (along bisector B2) between the half electrode 164 and the two quarter electrodes 165 and 166, and another thin strip of nonelectroded ceramic bisecting the half of the face 140*a* between the two quarter electrodes 165 and 166 (along half of bisector B1) . Each of the output electrodes 164, 165 and 166 is preferably bonded to the face 140*a* of the output layer 140 by electro-deposition, but may also be applied by screen printing, vapor deposition, cofiring or other similar process.

The electrodes upon which electrical leads are to be attached are preferably the quarter output electrodes 165 and 166. Each electrode 165 and 166 preferably has a copper foil bonded to and substantially covering it to provide a surface upon which to solder electrical leads and to prevent damage to the electrode 165 and 166 beneath it. Bonding of the copper foil to the electrodes 165 and 166 of the output layer 140 is preferably achieved using "Ciba-Geigy AV118" (CIBA) as manufactured by Ciba Specialty Chemicals Corporation, N.A. of East Lansing, Mich. In an alternate embodiment an additional output terminal comprising a copper foil may be bonded to and substantially cover semicircular output electrode 164 in order to provide a center-tapped output terminal.

As can be seen in FIGS. 9 and 10, each face 140*a* and 140*b* of the output layer 140 has electrodes thereon which are in opposing relation with the one or more electrodes on the opposite face 140*a* or 140*b*. On the first face 140*a* of the output layer 140, the larger rectangular output electrode 164 is on one side of bisector B2, and the two quarter output electrodes 165 and 166 are on the opposite side of bisector B2. On the opposite face 140*b* of the output layer 140, the intermediate rectangular electrodes 162 and 163 are on opposite sides of bisector B1, where the two bisectors B1 and B2 are perpendicular to each other. Thus, the electrodes on opposing faces 140*a* and 140*b* and on one side of bisector B2 are the large rectangular output electrode 164 and half of each of the intermediate electrodes 162 and 163. The electrodes on opposing faces 140*a* and 140*b* and on the opposite side of bisector B2 are the two quarter electrodes 165 and 166 and the remaining half of each of the intermediate electrodes 162 and 163.

In other words, the two perpendicular bisectors B1 and B2 essentially define four quadrants 141, 142, 143 and 144 of the output layer 140. On opposing faces 140*a* and 140*b* of the first quadrant 141 are quarter electrode 165 and half of intermediate electrode 162. On opposing faces 140*a* and 140*b* of the second quadrant 142 are half of the large rectangular output electrode 164 and the other half of intermediate electrode 162. On opposing faces 140*a* and 140*b* of the third quadrant 143 are the other half of large rectangular output electrode 164 and half of intermediate electrode 163. Lastly, on opposing faces 140*a* and 140*b* of the fourth quadrant 144 are quarter electrode 166 and the other half of intermediate electrode 163.

The output layer 140 is polarized in the thickness direction, i.e., in the direction(s) perpendicular to the intermediate electrodes 162 and 163 and output electrodes 164, 165 and 166 on the major faces 140a and 140b of the output layer 140 as indicated by arrows 152a–d. This polarization is such that when a voltage is applied across an output electrode 164, 165 or 166 and an intermediate electrode 162 or 163, the portion of the output layer 140 between the two electrodes will deform in the longitudinal direction, i.e., a d31 mode deformation in a direction parallel to the planes of electrodes 162 and 163, and 164, 165 and 166. More specifically, that quadrant 141, 142, 143 or 144 of the output layer 140 between the selected electrodes 162 or 163, and 164, 165 or 166 will deform. Conversely, a deformation of the output layer 140 will generate a voltage (in the g33 mode) between the intermediate and output electrodes 162 and 163, and 164, 165 and 166. More specifically, a deformation of a quadrant 141, 142, 143 or 144, will generate a g33 mode voltage across the electrodes 162 and 163, and 164, 165 and 166 on the respective faces 140a and 140b of each quadrant 141, 142, 143 or 144.

The output layer 140 is preferably polarized in a manner that places the quadrants 141, 142, 143 and 144 electrically in series with each other. More specifically, the direction of polarization of quadrants 141 and 143 (indicated by arrows 152a and 152c) is opposite to the direction of the polarization of quadrants 142 and 144 (indicated by arrows 152b and 152d). Because of the relative orientation of the polarization of the quadrants 141, 142, 143 and 144 to the intermediate electrodes 162 and 163 and the output electrodes 164, 165 and 166, the voltages generated in each quadrant 141, 142, 143 and 144 are placed electrically in series.

In operation, an input voltage may be applied to input terminals 181 and 182 connected to the input electrodes 161 and 167 respectively. When a voltage of a first polarity is applied across the input electrodes 161 and 167 on the faces 160a and 160b of the input layer 160, the input layer 160 deforms, expanding parallel to the plane of the faces 160a and 160b of the input layer 160. Because the input layer 160 is firmly bonded to the insulator layer 150 and thereby indirectly to the output layer 140, the output layer 140 also expands. The expansion of the output layer 140 piezoelectrically generates a voltage (in the g33 mode) across the intermediate electrodes 162 and 163 and the output electrodes 164, 165 and 166. More specifically, the expansion of the first quadrant 141 generates a g33 mode voltage of the first polarity across electrodes 165 and 162 and the expansion of the second quadrant 142 generates a voltage of a second opposite polarity across electrodes 164 and 162. The expansion of the third quadrant 143 generates a voltage of the first polarity across electrodes 164 and 163 and the expansion of the fourth quadrant 144 generates a voltage of the second polarity across electrodes 163 and 166.

When a voltage of the second opposite polarity is applied across the input electrodes 161 and 167 on the faces 160a and 160b of the input layer 160, the input layer 160 deforms, contracting parallel to the plane of the faces 160a and 160b of the input layer 160. Because the input layer 160 is firmly bonded to the output layer 140, the output layer 140 also contracts. The contraction of the output layer 140 piezoelectrically generates a voltage (in the g33 mode) across the intermediate electrodes 162 and 163 and the output electrodes 164, 165 and 166. More specifically, the contraction of the first quadrant 141 generates a voltage of the second polarity across electrodes 165 and 162 and the contraction of the second quadrant 142 generates a voltage of the first polarity across electrodes 164 and 162. The contraction of the third quadrant 143 generates a voltage of the second polarity across electrodes 164 and 163 and the contraction of the fourth quadrant 144 generates a voltage of the first polarity across electrodes 163 and 166.

The intermediate electrodes 162 and 163 and the output electrodes 164, 165 and 166 are configured so as to place the potentials across each quadrant 141, 142, 143 and 144 electrically in series. Intermediate electrode 162 electrically connects the first and second quadrants 141 and 142 in series. Likewise, the large rectangular output electrode 164 electrically connects the second and third quadrants 142 and 143 in series, and intermediate electrode 163 electrically connects the third and fourth quadrants 143 and 144 in series. Thus, the potentials in each quadrant 141, 142, 143 and 144 are electrically in series and their sum may be taken across the two quarter output electrodes 165 and 166. The output voltage which is the sum of all the voltages developed in the four quadrants 141, 142, 143 and 144 may be taken across terminals 183 and 184 connected to output electrodes 165 and 166 respectively.

Although the description of the transformer has heretofore included only transformers having a pair of intermediate electrodes, and three output electrodes, it should be understood that the number of intermediate electrodes and output electrodes can be increased. It will be understood that a PT can be made having N intermediate electrodes, and at least N+1 output electrodes and 2N sectors polarized in alternating directions.

Figure 11:
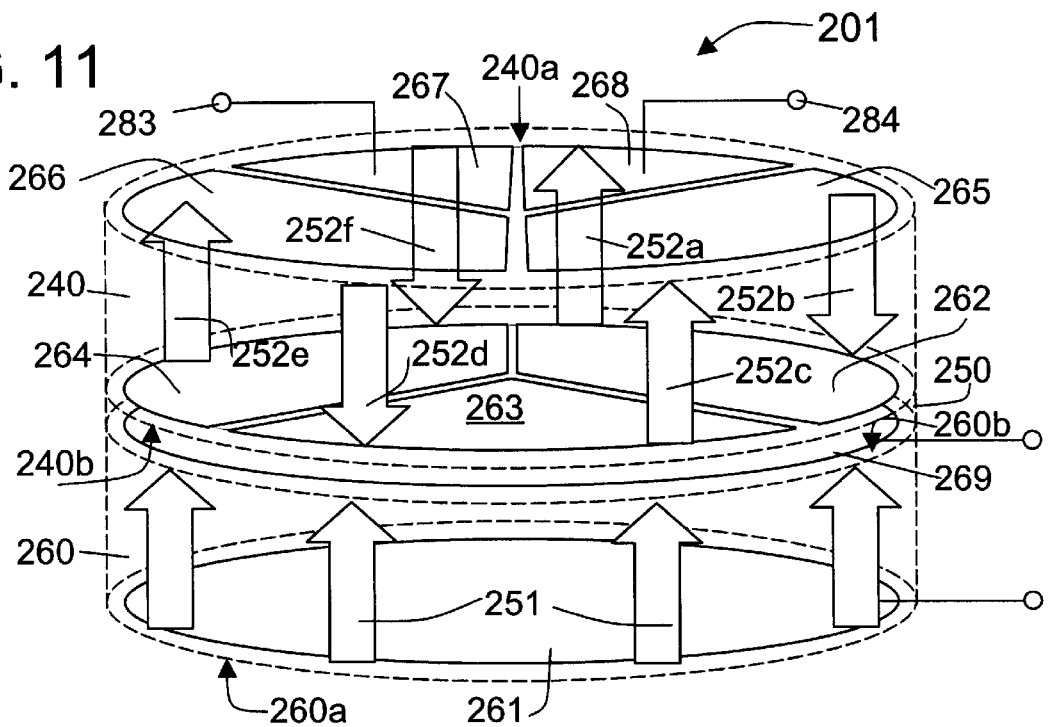
FIG. 11 is a perspective view of another embodiment of the piezoelectric transformer using three intermediate electrodes and four outboard output electrodes
Figure 12:
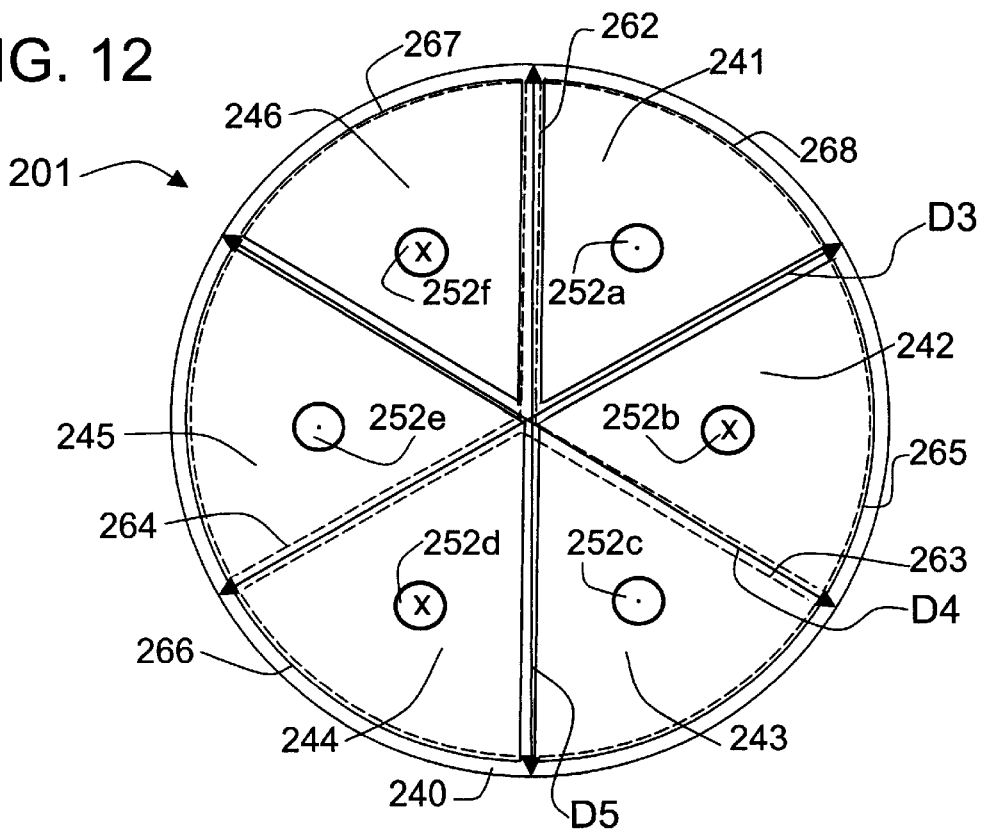
FIG. 12 is a plan view of the piezoelectric transformer of FIG. 11 showing the polarization directions of the output layer.

For example, referring to FIGS. 11 and 12: In an alternate embodiment of a PT 201, a disk shaped PT 201 is provided with an input layer 260 and an insulator layer 250 substantially as described in the PT of FIGS. 4 through 8. The input layer 260 is a disk shaped mass of PZT with input electrodes 261 and 269 bonded to each of its opposing major faces 260b and 260a, respectively. The first input electrode 261 comprises a circular electrode substantially covering the face 260a of the ceramic layer 260. The second input electrode 269 also comprises a circular electrode substantially covering the second face 260b of the input ceramic layer 260. Each of the input electrodes 261 and 269 is preferably bonded to its respective face of the input layer 260 by electro-deposition, but may also be applied by screen printing, vapor deposition, cofiring or other conventional process. The electrodes 261 and 269 preferably each have a terminal 281 and 282 comprising a copper foil bonded to and substantially covering them to provide a surface upon which to solder electrical leads. Bonding of the copper foil to the input layer 260 and the electrodes 261 and 269 is preferably achieved using "Ciba-Geigy AV118" (CIBA) as manufactured by Ciba Specialty Chemicals Corporation, N.A. of East Lansing, Mich.

The input layer 260 is polarized in the thickness direction, i.e., in a direction perpendicular to the electrodes 261 and 269 on the major faces 260a and 260b of the input layer 260 as indicated by arrows 251. Preferably, the entirety of the input ceramic layer 260 is polarized in one direction, i.e., the direction of poling between input electrodes 261 and 269 is in the same throughout the layer 260. The polarization of the input layer 260 is such that when a voltage is applied across the input electrodes 261 and 269, the input layer 260 deforms in the longitudinal direction, i.e., a deformation in a direction parallel to the planes of electrodes 261 and 269.

The PT 201 also comprises an insulator layer 250. The insulator layer 250 preferably comprises an insulator material which has a similar coefficient of expansion as the parts of the PT 201 to which it is bonded such as ceramic, alumina, mica, or KAPTON film as manufactured by E. I. du Pont de Nemours and Company of Wilmington, Del. The insulator layer 250 is bonded to the second face 260b of the input layer 260 and the second input electrode 269 as well as the terminal 282 thereon. The insulator layer 250 is bonded to the second face 260b of the input layer 260 and the second input electrode 269. The insulator layer 250 extends at least across the area of the second input electrode 269, and most preferably extends across and is bonded to the complete face 260b of the input layer 260. The insulator layer 250 prevents the input electrode 269 from contacting the electrodes of the output layer described herein below. Bonding of the insulator layer 250 to the input layer 260 and input electrode 269 is preferably achieved using "Ciba-Geigy AV118" (CIBA) as manufactured by Ciba Specialty Chemicals Corporation, N.A. of East Lansing, Mich.

The PT 201 also comprises an output layer 240 comprising a disk shaped mass of PZT having two faces 240a and 240b, with the second face 240b intimately bonded to the insulator layer 250. Bonding of the insulator layer 250 to the output layer 240 is preferably achieved using "Ciba-Geigy AV118" (CIBA) as manufactured by Ciba Specialty Chemicals Corporation, N.A. of East Lansing, Mich. Because the second face 240b of the output layer 240 is bonded to the insulator layer 250, it is also bonded indirectly the second face 260b of the input layer 260. output layer 240 that is intimately bonded to the insulator layer 250. The output layer 240 has output electrodes and intermediate electrodes bonded to opposing faces 240a and 240b of the output layer 240.

The output layer 240 differs from those (40 and 140) of the previous embodiments (1 and 101) in that it has a greater number of output electrodes. More specifically, the output layer 240 has three intermediate electrodes 262, 263 and 264 and four output electrodes 265, 266, 267 and 268 bonded to the faces 240b and 240a respectively of the output layer 240. The three intermediate electrodes are bonded to the second face 240b of the output ceramic layer 240 and in combination substantially cover the second face 240b and four output electrodes are bonded to the first face 240a of the output ceramic layer 240 and in combination substantially cover the first face 240a of the output layer 240. In this configuration each intermediate electrode 262, 263 and 264 substantially covers a 120 degree arc on the second face 240b of the output layer 240. Each of the intermediate electrodes 262, 263 and 264 is preferably bonded to the face 240b of the output layer 240 by electro-deposition, but may also be applied by screen printing, vapor deposition, cofiring or other similar process.

The output electrodes 265, 266, 267 and 268 comprise two electrodes 265 and 266 each substantially covering a 120 degree arc and two electrodes 267 and 268 each substantially covering a 60 degree arc on the first face 240a of the output layer 240. Each of the output electrodes 265, 266, 267, and 268 is preferably bonded to the face 240a of the output layer 240 by electro-deposition, but may also be applied by screen printing, vapor deposition, cofiring or other similar process.

The electrodes upon which electrical leads are to be attached are preferably the quarter output electrodes 267 and 268. Each electrode 267 and 268 preferably has a copper foil bonded to and substantially covering it to provide a surface upon which to solder electrical leads and to prevent damage to the electrode 267 and 268 beneath it. Bonding of the copper foil to the electrodes 267 and 268 of the output layer 240 is preferably achieved using "Ciba-Geigy AV118" (CIBA) as manufactured by Ciba Specialty Chemicals Corporation, N.A. of East Lansing, Mich. In an alternate embodiment, additional output terminals comprising a copper foil may be bonded to and substantially cover output electrodes 265 and/or 266 in order to provide centrally tapped output terminal(s).

Three diameters D3, D4 and D5, preferably having a 120 degree relation to each other trisect the output layer 240 to define six wedges or sextants 241, 242, 243, 244, 245 and 246 of the output layer 240. The electrodes are arranged on opposing faces 240a and 240b such that each electrode 265, 266, 267 and 268 on one face 240a is in opposing relation with at least one other electrode 262, 263 and 264 on the opposite face 240b of the output layer 240. More specifically, the first face 240a of the first sextant 241 is substantially covered by 60 degree electrode 268, and on its second face 240b by intermediate electrode 262. The first face 240a of the second sextant 242 is substantially covered by 120 degree electrode 265, and on its second face 240b by intermediate electrode 262. The first face 240a of the third sextant 243 is substantially covered by 120 degree electrode 265, and on its second face 240b by intermediate electrode 263. The first face 240a of the fourth sextant 242 is substantially covered by 120 degree electrode 266, and on its second face 240 by intermediate electrode 263. The first face 240a of the fifth sextant 245 is substantially covered by 120 degree electrode 266, and on its second face 240b by intermediate electrode 264. The first face 240a of the sixth sextant 246 is substantially covered by 60 degree electrode 267, and on its second face 240b by intermediate electrode 264.

The output layer 240 is polarized in the thickness direction, i.e., in the direction(s) perpendicular to the intermediate electrodes 262, 263 and 264 and output electrodes 265, 266, 267 and 268 on the major faces 240a and 240b of the output layer 240 as indicated by arrows 252a–f. This polarization is such that when a voltage is applied across an output electrode 265, 266, 267 or 268 and an intermediate electrode 262, 263 or 264, the portion of the output layer 240 between the two electrodes will deform in the longitudinal direction, i.e., in a direction parallel to the planes of electrodes 262, 263 and 264 and 265, 266, 267 and 268. More specifically, that sextant 241, 242, 243, 244, 245 or 246 of the output layer 240 between the selected electrodes 262, 263 or 264 and 265, 266, 267 or 268 will deform. Conversely, a deformation of the output layer 240 will generate a voltage (in the radial g mode) between the intermediate and output electrodes 262, 263 and 264 and 265, 266, 267 and 268. More specifically, a deformation of a sextant 241, 242, 243, 244, 245 or 246, will generate a voltage across the electrodes 262, 263 and 264 and 265, 266, 267 and 268 on the respective faces 240a and 240b of each sextant 241, 242, 243, 244, 245 or 246.

The output layer 240 is preferably polarized in a manner that places the sextants 241, 242, 243, 244, 245 and 246.electrically in series with each other. Alternating sextants 241, 243 and 245 are polarized in the opposite direction in relation to adjacent sextants 242, 244 and 246. More specifically, the direction of polarization of sextants 241, 243 and 245 (indicated by arrows 252a, 252c and 252e) is opposite to the direction of the polarization of sextants 242, 244 and 246 (indicated by arrows 252b, 252d and 252f). Because of the relative orientation of the polarization of the sextants 241, 242, 243, 244, 245 and 246 to the intermediate electrodes 262, 263 and 264 and the output electrodes 264, 265, 266, 267 and 268, the voltages generated in each sextant 241, 242, 243, 244, 245 and 246 are placed electrically in series.

In operation, an input voltage may be applied to input terminals 281 and 282 connected to the input electrodes 261 and 267 respectively. When a voltage of a first polarity is applied across the electrodes 261 and 269 on the faces 260a and 260b of the input layer 260, the input layer 260 deforms, expanding parallel to the plane of the faces 260a and 260b of the input layer 260. Because the input layer 260 is firmly bonded to the insulator layer 250 and thereby indirectly bonded to the output layer 240, the output layer 240 also expands. The expansion of the output layer 240 piezoelectrically generates a voltage (in the radial mode) across the intermediate electrodes 262, 263 and 264 and the output electrodes 264, 265, 266, 267 and 268. More specifically, the expansion of the first sextant 241 generates a voltage of the first polarity across electrodes 268 and 262 and the expansion of the second sextant 242 generates a voltage of a second opposite polarity across electrodes 265 and 262. The expansion of the third sextant 243 generates a voltage of the first polarity across electrodes 265 and 263 and the expansion of the fourth sextant 244 generates a voltage of the second polarity across electrodes 263 and 266. The expansion of the fifth sextant 245 generates a voltage of the first polarity across electrodes 266 and 264 and the expansion of the sixth sextant 246 generates a voltage of the second polarity across electrodes 264 and 267.

When a voltage of the second opposite polarity is applied across the faces 260a and 260b of the input layer 260, the input layer 260 deforms, contracting parallel to the plane of the faces 260a and 260b of the input layer 260. Because the input layer 260 is firmly bonded to the output layer 240, the output layer 240 also contracts. The contraction of the output layer 240 piezoelectrically generates a voltage (in the radial mode) across the intermediate electrodes 262, 263 and 264 and the output electrodes 264, 265, 266, 267 and 268. More specifically, the contraction of the first sextant 241 generates a voltage of the second polarity across electrodes 268 and 262 and the contraction of the second sextant 242 generates a voltage of the first opposite polarity across electrodes 265 and 262. The contraction of the third sextant 243 generates a voltage of the second polarity across electrodes 265 and 263 and the contraction of the fourth sextant 244 generates a voltage of the first polarity across electrodes 263 and 266. The contraction of the fifth sextant 245 generates a voltage of the second polarity across electrodes 266 and 264 and the contraction of the sixth sextant 246 generates a voltage of the first polarity across electrodes 264 and 267.

The intermediate electrodes 262, 263 and 264 and the output electrodes 265, 266, 267 and 268 are configured so as to place the potentials across each sextant 241, 242, 243, 244, 245 and 246 electrically in series. Intermediate electrode 262 electrically connects the first and second sextants 241 and 242 in series. Likewise, the output electrode 265 electrically connects the second and third sextants 242 and 243 in series, and intermediate electrode 263 electrically connects the third and fourth sextants 243 and 244 in series. Finally, output electrode 266 electrically connects the fourth and fifth sextants 244 and 245 in series, and intermediate electrode 264 electrically connects the fifth and sixth sextants 245 and 246 in series. Thus, the potentials in each sextant 241, 242, 243, 244, 245 and 246 are electrically in series and their sum may be taken across the two 60 degree output electrodes 267 and 268. The output voltage which is the sum of all the voltages developed in the six sextants 241, 242, 243, 244, 245 and 246 may be taken across terminals 283 and 284 connected to output electrodes 267 and 268 respectively.

Thus, it can be seen that for a PT having N intermediate electrodes, there are at least N+1 output electrodes and 2N sectors polarized in alternating directions. Thus, for example, the output layer may have four intermediate electrodes and five output electrodes covering the faces of an output layer having eight polarized sectors.

Figure 13:
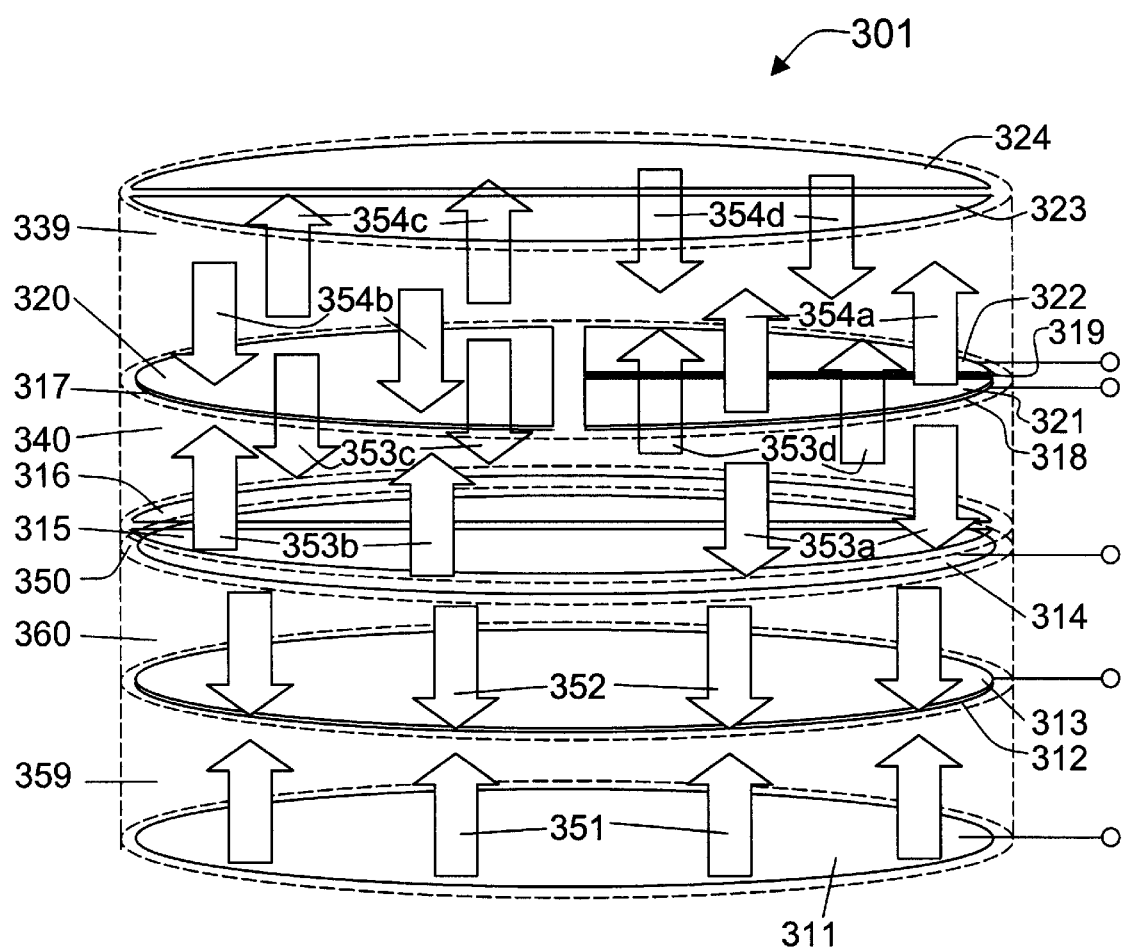
FIG. 13 is a perspective view of yet another embodiment of the transformer using multiple input layers and output layers.
Figure 14:
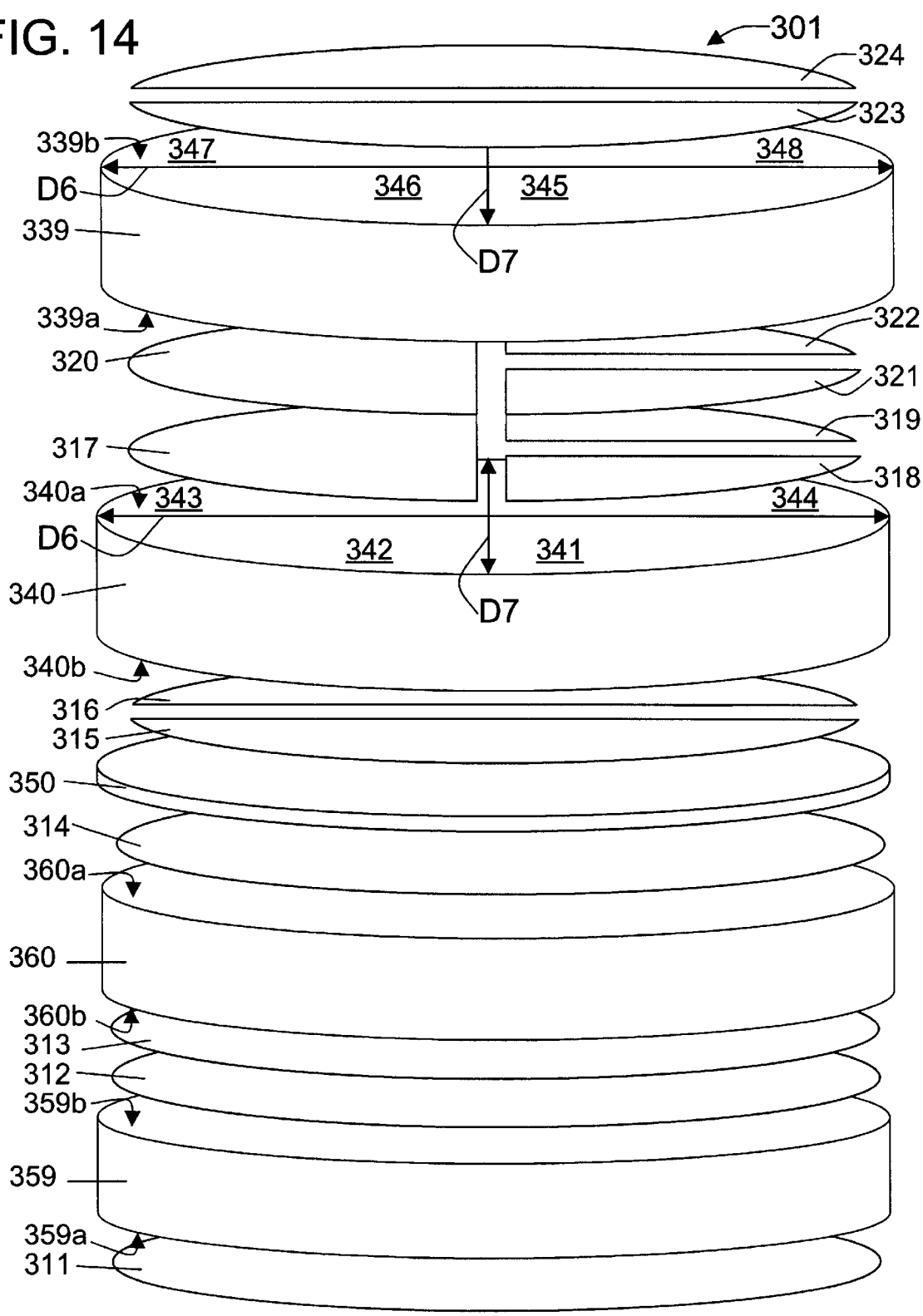
FIG. 14 is a blown up perspective view of the piezoelectric transformer of FIG. 13 showing the details of its construction.

Referring now to FIGS. 13 and 14: In yet another embodiment of the invention, the PT 301 may comprise more than one input layer or more than one output layer or both. In the embodiment depicted in FIGS. 13 and 14, the PT 301 comprises two input layers and two output layers bonded to opposite sides of an insulator layer. More specifically, the input side of the PT 301 comprises first and second input layers 359 and 360 bonded to a central input terminal 362 and between two outboard input terminals 361 and 363. The input layers 359 and 360 each comprise a thin layer of an electroactive material, preferably PZT with electrodes 311 and 312, and 313 and 314 respectively (silver and/or nickel) deposited thereon. Preferably, the input layers 359 and 360 and electrodes 311 and 312, and 313 and 314, and terminals 361, 362 and 363 are circular in order to take advantage of the resonant frequency in the radial mode vibration. However, the input layers 359 and 360 may alternatively be rectangular or bar-shaped in order to use the longitudinal or planar mode of vibration. Alternatively, the thickness mode vibration may be used in either the circular or the rectangular configuration.

Electrodes 311 and 312, and 313 and 314 are provided on the two major faces of each of the input layers 359 and 360 respectively. Since in the preferred embodiment of the invention, the input layers 359 and 360 are disk shaped masses of PZT, the input electrodes 311 and 312, and 313 and 314 comprise circular electrodes. More specifically, the first input layer 359 has two opposing faces 359a and 359b on which are deposited electrodes 311 and 312 respectively. Also, the second input layer 360 has two opposing faces 360b and 360a on which are deposited electrodes 313 and 314 respectively. Each of the input electrodes 311, 312, 313 and 314 is preferably bonded to its respective face 359a, 359b, 360b and 360a by electro-deposition, but may also be applied by screen printing, vapor deposition, cofiring or other conventional process.

A first input terminal 361 is provided comprising a circular copper foil bonded to the first face 359a of the first input ceramic layer 359 and substantially covers the first face 359a and electrode 311 thereon. A second input terminal 363 comprises a circular copper foil bonded to the first face 360a of the second input ceramic layer 360 and substantially covers the first face 360a and the electrode 314 thereon. A central input electrode 362 comprises a circular copper foil bonded to both second faces 359b and 360b of the input layers 359 and 360 respectively and substantially covers the second faces 359b and 360b of the input ceramic layer 359 and 360 and the respective electrodes 312 and 313. Bonding of the input layers 359 and 360 to the central input terminal 362 and to each other is preferably achieved using "Ciba-Geigy AV118" (CIBA) as manufactured by Ciba Specialty Chemicals Corporation, N.A. of East Lansing, Mich. The input terminals 361, 362 and 363 provide a surface upon which to solder electrical leads and to prevent damage to the electrode 311, 312, 313 and 314. Bonding of the copper foil input terminals 361, 362 and 363 provide to the input layers 359 and 360 and the electrodes 361, 362 and 363 is preferably 1201 achieved using "Ciba-Geigy AV118".

The input layers 359 and 360 are polarized in the thickness direction. More specifically, the first input layer 359 is polarized in a direction perpendicular to the major faces 359a and 359b of the input layer 359 as indicated by arrows 351. The second input layer 360 is polarized in a direction perpendicular to the major faces 360a and 360b of the input layer 360 as indicated by arrows 352. Preferably, the first and second input ceramic layer 359 and 360 are polarized in opposite directions, and more preferably are polarized towards the central terminal 362.

The polarization of the first input layer 359 is such that when a voltage is applied across the input terminals 361 and 362, the input layer 359 deforms in the longitudinal direction, i.e., a radial or planar mode deformation in a direction parallel to the planes of terminals 361 and 362. The polarization of the second input layer 360 is also such that when a voltage is applied across the input terminals 363 and 362, the input layer 360 deforms in the longitudinal direction, i.e., a radial or planar mode deformation in a direction parallel to the planes of terminals 363 and 362. More specifically, when a voltage is applied across terminals 361 and 362, and simultaneously applied across terminals 362 and 363, both input layers 359 and 360 will deform in the same direction(s) in the longitudinal plane parallel to the plane of interface along the central terminal 362.

The PT also comprises an insulator layer 350 bonded to the first face of the second input layer 360 and the second input terminal 363. The insulator layer 350 preferably comprises an insulator material which has a similar coefficient of expansion as the parts of the PT 301 to which it is bonded such as ceramic, alumina, mica, or KAPTON film as manufactured by E. I. du Pont de Nemours and Company of Wilmington, Del. The insulator layer 350 extends at least across the area of the second input terminal 363, and most preferably extends across and is bonded to the complete face 360b of the second input layer 360. The insulator layer 350 prevents the input terminal 363 from contacting the electrodes of the output layer described herein below. Bonding of the insulator layer 350 to the input layer 360 and input terminal 363 is preferably achieved using "Ciba-Geigy AV118" (CIBA) as manufactured by Ciba Specialty Chemicals Corporation, N.A. of East Lansing, Mich.

The PT 301 also comprises a pair of output layers 339 and 340 intimately bonded to the insulator layer 350. The output layers 339 and 340 of the PT 301 each comprise another layer of an electroactive material, preferably PZT with electrodes (silver and/or nickel) 315-324 deposited thereon in specific patterns described herein below. Preferably, the output layers 339 and 340 and the terminals 364 and 365 are also circular in order to take advantage of the resonant frequency in the radial mode vibration. However, the output layers may alternatively be square, rectangular or bar-shaped in order to use the longitudinal or planar mode of vibration as in the PT 101 of FIG. 9. Alternatively, the thickness mode resonant frequency may be used with either a circular or a rectangular configuration.

In the preferred embodiment of the invention, the first output layer 340 is a disk shaped mass of PZT having two faces 340a and 340b. The second face 340b of the output layer 340 is bonded to the insulator layer 350 and thereby indirectly to the first face 360a of the second input layer 360. Bonding of the first output layer 340 to the insulator layer 350 is preferably achieved using "Ciba-Geigy AV118" (CIBA) as manufactured by Ciba Specialty Chemicals Corporation, N.A. of East Lansing, Mich.

Each output layer 339 and 340 has patterned output electrodes bonded to and substantially covering the opposing faces 339a, 339b, 340a and 340b of the output layers 339 and 340 respectively. The first output layer 340 also comprises the two semicircular output electrodes 315 and 316 that are electrically isolated from each other on the second face 340b of the output layer 340. The semicircular electrodes 315 and 316 are arranged in a non-overlapping manner such that each of them is on the opposite side a diameter D6 of the second face 340b of the output ceramic layer 340. In other words, in combination the semicircular electrodes 315 and 316 substantially cover the second face 340b of the output ceramic layer 340, with the exception of a thin strip of nonelectroded ceramic in the middle of the face 340b along diameter D6.

Output electrodes 317, 318 and 319 are bonded to the first face 340a of the output ceramic layer 340, substantially covering the face 340a. The output electrodes preferably comprise a semicircular electrode 317 and two quarter electrodes 318 and 319 that are electrically isolated from each other. The semicircular electrode 317 and two quarter electrodes 318 and 319 are arranged in a non-overlapping manner such that the semicircular electrode 317 is on one side of a seventh diameter D7 of the second face 340b and the two quarter electrodes 318 and 319 are on the opposite side of the diameter D7 of the second face 340b of the output ceramic layer 340. Preferably the sixth diameter D6 and the seventh diameter D7 are at 90 degree angles to each other. The two quarter electrodes 318 and 319 are not only electrically isolated from the semicircular electrode 317, but are also electrically isolated from each other, being located on opposite sides of the sixth diameter D6 on the remaining semicircular portion of the second face 340b of the ceramic layer 340. In other words, in combination the semicircular electrode 317 and two quarter electrodes 318 and 319 substantially cover the second face 340b of the first output ceramic layer 340, with the exception of a first thin strip of nonelectroded ceramic in the middle of the face 340b (along diameter D7) between the semicircular electrode 317 and the quarter electrodes 318 and 319, and another thin strip of nonelectroded ceramic bisecting the semicircle between the quarter electrodes 318 and 319 (along diameter D6).

In the preferred embodiment of the invention, the second output layer 339 is also a disk shaped mass of PZT having two faces 339a and 339b. The first face 339a of the output layer 339 is bonded to the first face 340a of the first output layer 340. Bonding of the second output layer 339 to the first output layer 340 is preferably achieved using "Ciba-Geigy AV118" (CIBA) as manufactured by Ciba Specialty Chemicals Corporation, N.A. of East Lansing, Mich.

The second output layer 339 also has patterned output electrodes bonded to and substantially covering its opposing faces 339a and 339b respectively. The second output layer 339 also comprises the two semicircular output electrodes 323 and 324 that are electrically isolated from each other on the second face 339b of the output layer 339. The semicircular electrodes 323 and 324 are arranged in a non-overlapping manner such that each of them is on the opposite side diameter D6 of the second face 339b of the output ceramic layer 339. In other words, in combination the semicircular electrodes 323 and 324 substantially cover the second face 339b of the output ceramic layer 339, with the exception of a thin strip of nonelectroded ceramic in the middle of the face 339b along diameter D6.

Output electrodes 320, 321 and 322 are bonded to the first face 339a of the output ceramic layer 339, substantially covering the face 339a. The output electrodes preferably comprise a semicircular electrode 320 and two quarter electrodes 321 and 322 that are electrically isolated from each other. The semicircular electrode 320 and two quarter electrodes 321 and 322 are arranged in a non-overlapping manner such that the semicircular electrode 320 is on one side of a seventh diameter D7 of the second face 339b and the two quarter electrodes 321 and 322 are on the opposite side of the diameter D7 of the second face 339b of the output ceramic layer 339. Preferably the sixth diameter D6 and the seventh diameter D7 are at 90 degree angles to each other. The two quarter electrodes 321 and 322 are not only electrically isolated from the semicircular electrode 320, but are also electrically isolated from each other, being located on opposite sides of the sixth diameter D6 on the remaining semicircular portion of the second face 339b of the ceramic layer 339. In other words, in combination the semicircular electrode 320 and two quarter electrodes 321 and 322 substantially cover the second face 339b of the second output ceramic layer 339, with the exception of a first thin strip of nonelectroded ceramic in the middle of the face 339b (along diameter D7) between the semicircular electrode 320 and the quarter electrodes 321 and 322, and another thin strip of nonelectroded ceramic bisecting the semicircle between the quarter electrodes 321 and 322 (along diameter D6).

The output layers 340 and 339 are preferably bonded together at their respective faces 340b and 339b. Preferably, the layers 340 and 339 are bonded to each other such that the electrodes 317, 318 and 319 on the face 340b of the first output layer 340 are aligned with the respective electrodes 320, 321 and 322 on the face 339b of the second output layer 339. and thereby shares the electrodes 366, 367 and 368 on that face 340a. Thus, output electrodes 366, 367 and 368 are bonded to the first face 339a of the output ceramic layer 339, substantially covering the face 339a. Bonding together of the output layers 340 and 339 is preferably achieved using "Ciba-Geigy AV118" (CIBA) as manufactured by Ciba Specialty Chemicals Corporation, N.A. of East Lansing, Mich.

The electrodes upon which electrical leads are to be attached are preferably the quarter output electrodes 318 and 319, and 321 and 322. More specifically, a first copper foil terminal 364 is bonded between and substantially covers electrodes 318 and 321, and a second copper foil terminal 365 is bonded between and substantially covers electrodes 319 and 322. The terminals 364 and 365 provide a surface upon which to solder electrical leads and to prevent damage to the electrodes 318 and 319, and 321 and 322 beneath them. Bonding of the copper foil terminals 364 and 365 to the electrodes 318 and 319, and 321 and 322 respectively of the output layers 340 and 339 is achieved preferably using "Ciba-Geigy AV118" (CIBA) as manufactured by Ciba Specialty Chemicals Corporation, N.A. of East Lansing, Mich.

As can be seen in FIGS. 13 and 14, each face 340a and 340b of the first output layer 340 has electrodes thereon which are in opposing relation with the one or more electrodes on the opposing face 340a or 340b. Also, each face 339a and 339b of the second output layer 339 has electrodes thereon which are in opposing relation with at least one electrode on the opposing face 339a or 339b. The two perpendicular diameters D6 and D7 essentially define four quadrants 341, 342, 343 and 344 of the first output layer 340 and four quadrants 345, 346, 347 and 348 of the second output layer 339.

On opposing faces 340a and 340b of the first quadrant 341 of the first output layer 340 are quarter electrode 318 and half of semicircular electrode 315. On opposing faces 340a and 340b of the second quadrant 342 are half of semicircular electrode 317 and the other half of semicircular electrode 315. On opposing faces 340a and 340b of the third quadrant 343 are the other half of semicircular electrode 317 and half of semicircular electrode 316. Lastly, on opposing faces 340a and 340b of the fourth quadrant 344 are quarter electrode 319 and the other half of semicircular electrode 316.

On opposing faces 339a and 339b of the first quadrant 345 of the second output layer 339 are quarter electrode 321 and half of semicircular electrode 323. On opposing faces 339a and 339b of the second quadrant are half of semicircular electrode 320 and the other half of semicircular electrode 323. On opposing faces 339a and 339b of the third quadrant 347 are the other half of semicircular electrode 320 and half of semicircular electrode 324. Lastly, on opposing faces 339a and 339b of the fourth quadrant 348 are quarter electrode 322 and the other half of semicircular electrode 324.

The first output layer 340 is polarized in the thickness direction, i.e., in the direction(s) perpendicular to the output electrodes on the major faces 340a and 340b of the output layer 340 as indicated by arrows 353a –d. This polarization is such that when a voltage is applied across an output electrode 315 or 316 and another output electrode 317, 318 or 319, the portion (quadrant) of the output layer 340 between the two electrodes will deform in the longitudinal direction, i.e., a planar or radial mode deformation in a direction parallel to the planes of electrodes 315 and 316 and 317, 318 and 319. More specifically, that quadrant 341, 342, 343 or 344 of the output layer 340 between the selected electrodes 315 or 316 and 317, 318 or 319 will deform. Conversely, a deformation of the output layer 340 generates a voltage between the output electrodes 315 and 316 and 317, 318 and 319 on the respective faces 340a and 340b of each quadrant 341, 342, 343 or 344.

The output layer 340 is preferably polarized in a manner that places the quadrants 341, 342, 343 and 344 electrically in series with each other. More specifically, the direction of polarization of quadrants 341 and 343 (indicated by arrows 353a and 353c) is opposite to the direction of the polarization of quadrants 342 and 344 (indicated by arrows 353b and 353d). Because of the relative orientation of the polarization of the quadrants 341, 342, 343 and 344 to electrodes 315 and 316, and 317, 318 and 319 the voltages generated in each quadrant 341, 342, 343 and 344 are placed electrically in series.

The second output layer 339 is polarized in the thickness direction, i.e., in the direction(s) perpendicular to the output electrodes on the major faces 339a and 339b of the output layer 339 as indicated by arrows 354a–d. This polarization is such that when a voltage is applied across an output electrode 323 or 324, and another output electrode 320, 321 or 322, the portion of the output layer 340 between the two electrodes will deform in the longitudinal direction, i.e., in a direction parallel to the planes of electrodes 323 and 324, and 320, 321, and 322. More specifically, that quadrant 345, 346, 347 or 348 of the output layer 339 between the selected electrodes 323 or 324, and 320, 321, or 322 will deform. Conversely, a deformation of the second output layer 339 generates a voltage between the output electrodes 323 and 324, and 320, 321, and 322 on the respective faces 339a and 339b of each quadrant 345, 346, 347 or 348.

The second output layer 339 is preferably polarized such that the direction of polarization of each quadrant 345, 346, 347 and 348 is opposite to the direction of polarization of the quadrant 341, 342, 343 and 344 of the first output layer 340 on the opposite side of the electrodes 317, 318 and 319, and 320, 321 and 322 between the layers 340 and 339. Thus, the direction of polarization of quadrants 345 and 347 (indicated by arrows 354a and 354c) is opposite to the direction of the polarization of quadrants 346 and 348 (indicated by arrows 354b and 354d). Also, quadrants 341 and 345 are polarized in opposite directions and preferably away from electrodes 318 and 321. In a like manner, quadrants 342 and 346 are polarized in opposite directions and preferably towards electrodes 317 and 320. Finally, quadrants 343 and 347 are polarized in opposite directions and preferably away from electrodes 317 and 320, and quadrants 344 and 348 are polarized in opposite directions and preferably towards electrodes 319 and 322.

Because of the relative orientation of the polarization of the quadrants 341, 342, 343 and 344 of output layer 340 to the electrodes 315 and 316, and 317, 318 and 319 the voltages generated in each quadrant 341, 342, 343 and 344 of the first output layer 340 are placed electrically in series. Furthermore, because of the relative orientation of the polarization of the quadrants 345, 346, 347 and 348 of output layer 339 to the output electrodes 323 and 324, and 320, 321 and 322, voltages generated in each quadrant 345, 346, 347 and 348 of second output layer 339 are placed electrically in series and are additive with the voltages generated in the respective opposing quadrant 341, 342, 343 and 344 of the first output layer 340.

In operation, an input voltage may be applied to input terminals 361 and 362 connected to the input electrodes 311 and 312, respectively, and may also be applied to input terminals 362 and 363 connected to the input electrodes 312 and 313, respectively. When a voltage of a first polarity is applied across the input electrodes 312 and 311 and 312 and 313, of input layers 359 and 360 respectively, the input layers 359 and 360 deform radially expanding. Because the input layer 360 is firmly bonded to the insulator layer 350 and indirectly to the output layers 339 and 340, the output layers 339 and 340 also expand. The expansion of the first output layer 340 piezoelectrically generates a voltage across electrodes 315 and 316, and electrodes 317, 318 and 319. Also, the expansion of the second output layer 339 piezoelectrically generates a voltage across electrodes 320, 321 and 322 and electrodes 323 and 324.

More specifically, the expansion of the first quadrant 341 of the first output layer 340 generates a voltage of the first polarity across electrodes 318 and 315 and the expansion of the first quadrant 345 of the second output layer 339 generates a voltage of the same polarity across electrodes 321 and 323. The expansion of the second quadrant 342 of the first output layer 340 generates a voltage of the second opposite polarity across electrodes 317 and 315 and the expansion of the second quadrant 346 of the second output layer 339 generates a voltage of the same polarity across electrodes 320 and 323. The expansion of the third quadrant 343 of the first output layer 340 generates a voltage of the first polarity across electrodes 317 and 316 and the expansion of the third quadrant 347 of the second output layer 339 generates a voltage of the same polarity across electrodes 320 and 324. Finally, the expansion of the fourth quadrant 344 of the first output layer 340 generates a voltage of the second polarity across electrodes 319 and 316 and the expansion of the fourth quadrant 348 of the second output layer 339 generates a voltage of the same polarity across electrodes 3222 and 324.

When a voltage of the second opposite polarity is applied across the input electrodes 312 and 311 and 312 and 313, of input layers 359 and 360 respectively, the input layers 359 and 360 deform radially contracting. Because the input layer 360 is firmly bonded to the insulator layer 350 and indirectly to the output layers 339 and 340, the output layers 339 and 340 also contract. The contraction of the first output layer 340 piezoelectrically generates a voltage across electrodes 315 and 316, and electrodes 317, 318 and 319. Also, the contraction of the second output layer 339 piezoelectrically generates a voltage across output electrodes 323 and 324 and electrodes 320, 321 and 322.

More specifically, the contraction of the first quadrant 341 of the first output layer 340 generates a voltage of the second polarity across electrodes 318 and 315 and the contraction of the first quadrant 345 of the second output layer 339 generates a voltage of the same polarity across electrodes 321 and 323. The contraction of the second quadrant 342 of the first output layer 340 generates a voltage of the first polarity across electrodes 317 and 315 and the contraction of the second quadrant 346 of the second output layer 339 generates a voltage of the same polarity across electrodes 320 and 323. The contraction of the third quadrant 343 of the first output layer 340 generates a voltage of the second polarity across electrodes 317 and 316 and the contraction of the third quadrant 347 of the second output layer 339 generates a voltage of the same polarity across electrodes 320 and 324. Finally, the contraction of the fourth quadrant 344 of the first output layer 340 generates a voltage of the first polarity across electrodes 319 and 316 and the contraction of the fourth quadrant 348 of the second output layer 339 generates a voltage of the same polarity across electrodes 322 and 324. Thus application of an alternating voltage across the input layers 359 and 360 of the transformer 301 produces an alternating voltage output across the output layers 339 and 340 of the transformer 301.

The output voltage taken between electrodes 318 and 319 is equal to the sum of the voltages generated across the all the quadrants 341, 342, 343 and 344 of the first output layer 340. The polarization and the output electrodes 315 and 316, and 317, 318 and 319 are configured so as to place the potentials across each quadrant 341, 342, 343 and 344 electrically in series. Electrode 315 electrically connects the first and second quadrants 341 and 342 in series. Likewise, electrode 317 electrically connects the second and third quadrants 342 and 343 in series, and electrode 316 electrically connects the third and fourth quadrants 343 and 344 in series. Thus, the potentials in each quadrant 341, 342, 343 and 344 are electrically in series and their sum may be taken across the two quarter output electrodes 318 and 319.

Likewise, the output voltage taken between electrodes 321 and 322 is equal to the sum of voltages developed across the quadrants 345, 346, 347 and 348 of the second output layer 339. The polarization and the electrodes 323 and 324, and 320, 321 and 322 are configured so as to place the potentials across each quadrant 345, 346, 346 and 348 electrically in series. Electrode 323 electrically connects the first and second quadrants 345 and 346 in series. Likewise, electrode 320 electrically connects the second and third quadrants 346 and 347 in series, and electrode 324 electrically connects the third and fourth quadrants 347 and 347 in series. Thus, the potentials in each quadrant 345, 346, 347 and 348 are electrically in series and their sum may be taken across the two quarter output electrodes 321 and 322.

In addition, because of the configuration of the output layers 340 and 339 with respect to their polarization and the configuration of the electrodes allows the voltages developed across both layers 340 and 339 to be summed at each electrode. More specifically, each of the electrodes between the layers 340 and 339 are in contact allowing the voltages developed across both output layers 340 and 339 to be summed. Also, since the first quadrants 341 and 345 of the output layers 340 and 339 respectively are both polarized away from the electrodes 318 and 321 between them, the voltages of both quadrants 341 and 345 do not cancel each other and may be summed. Likewise, since the fourth quadrants 344 and 348 of the output layers 340 and 339 respectively are both polarized towards the electrodes 319 and 322 between them the voltage taken at electrodes 319 and 322 is equal to the sum of the voltages generated across the fourth quadrants 344 and 348 of the output layers 340 and 339 respectively. Likewise, since the second quadrants 342 and 346 of the output layers 340 and 339 respectively are both polarized towards the electrodes 317 and 320 between them, the voltages in the second quadrants 342 and 346 are summed at the electrodes 317 and 320 between the output layers 340 and 339. Finally, since the third quadrants 343 and 347 of the output layers 340 and 339 respectively are both polarized away from the electrodes 317 and 320 between them, the voltages in the third quadrants 343 and 347 are summed at the electrodes 317 and 320 between the output layers 340 and 339.

Thus, the potentials developed across the quadrants 345, 346, 347 and 348 of the second output layer 339 are summed with the potentials developed across the quadrants 341, 342, 343 and 344 of the first output layer 340. For a transformer 301 comprising two output layers 340 and 339 of equal thickness the potential developed between each pair of quadrants is essentially double that of a single output layer of that thickness. The doubled potentials are then summed across the electrodes 364 and 365 and 366, 367 and 368 of the output layers 340 and 339. Using output layers (40 or 339 and 340) each having the same dimensions (diameter and thickness), the voltage developed between terminals 364 (connected to electrodes 318 and 321) and 365 (connected to electrodes 319 and 322) in the present transformer 301 are double the voltage developed across terminals 83 and 84 of the transformer 1 of the embodiment in FIG. 4.

In the embodiments of the invention described herein above, the frequency applied to the input layer(s) preferably is chosen to correspond to the natural resonant frequency of the transformer 1, 101, 201 or 301, and most preferably the radial or planar resonant frequency. In other words the frequency applied to the PT 1, 101, 201 or 301 preferably corresponds to the natural frequency along the plane parallel to that of the electrodes on the opposing major surfaces of the input and output layers. The resonant frequency of the transformer depends upon the dimensions of the transformer. More specifically, in a circular disk-shaped transformer, the radial mode resonant frequency is a function of the disk's planar frequency constant $N_P$ (radial mode frequency constant) in the plane of the disk, divided by twice the disk's diameter. For a rectangular plate-shaped transformer, the longitudinal mode resonant frequency along an axis equals the longitudinal mode frequency constant $N_1$ divided by the length of the transformer along that longitudinal axis.

At the resonant frequency, higher deformation in the input and output layer(s) of the device and higher gains may be realized. It has been observed that when the transformer is electrically actuated as described above, causing resonant frequency vibration of the device, it is possible to achieve deformation of ceramic layers one or more orders of magnitude greater than in prior "Rosen-type" piezoelectric transformers. Because the achievable deformation is one or more orders of magnitude greater than is possible in prior Rosen-type transformers, the power transmission capacity of the described transformer is similarly one or more orders of magnitude greater than is possible in prior Rosen-type transformers of a similar size. Thus, the PT will realize its highest gains and power transmission while operating at resonance.

While the above description contains many specificities, these should not be construed as limitations on the scope of the invention, but rather as exemplification of preferred embodiments thereof. Many other variations are possible, for example:

While in the preferred embodiment of the invention the ceramic layers are preferably constructed of a PZT ceramic material, other electroactive materials may be used in its place, and the ceramic layers can comprise piezoelectric, ferroelectric or other electroactive materials;

Although the intermediate electrodes have been shown to be of equal size, covering an equal area of the face of the output layer, it is within the scope of the invention to have some or all of the electrodes be of different area;

Although the one or more output electrodes have been shown to have an area equal to that of the intermediate electrodes, it is within the scope of the invention to have some or all of the electrodes be of different area;

Although the two smaller output electrodes have been shown to have a combined are area equal to that of one the intermediate electrodes or the other output electrodes, it is within the scope of the invention to have some or all of the electrodes be of different area;

Although the one or more output electrodes have been shown to overlap two intermediate electrodes equally, it is within the scope of the invention to have some or all of the electrodes overlap unequal sections;

Although the output electrodes have been shown to have one more in number than the intermediate electrodes, it is within the scope of the invention to have more output electrodes;

Although the terminals described and schematically represented herein have preferably comprised a copper foil, it is within the scope of the invention for the terminals to comprise other substances such as aluminum, gold, silver, other conductive metals or conductive substances;

Although the adhesive described has preferably comprised CIBA adhesive, it is within the scope of the invention to use other adhesives with strong mechanical coupling;

The input portion may comprise as few as one ceramic layer or may be of a multi-layer construction;

The output portion may comprise as few as one ceramic layer or may be of a multi-layer construction;

The input or output terminals may be eliminated and the electrical leads soldered directly to the electrodes;

Although the terminals described have preferably comprised two output terminals, more terminals may be added in order to center tap the output of the transformer;

The terminals may be centrally located between two layers or may be on the exterior surface of the transformer;

Rather than using an adhesive for bonding the layers and electrodes together, an alternative bonding method may be used such as cofiring or ultrasonic welding;

The direction of polarization of the input layers in multilayer transformers can vary and need not be toward the central electrode, but may be away from the central electrode or combinations thereof;

The direction of poling in the output layer(s) may alternate in the opposite directions of those shown in each polarized segments in the drawing figures;

The input or output layers may be operated in either the radial/planar mode or in the thickness mode;

The insulating layer need not be constructed of alumina, but may be constructed of other insulating materials; and The insulating layer need not extend to the edges or past the edges of the input and output layers, but may simply be large enough to isolate the high voltage electrode from the input or ground electrodes.

Accordingly, the scope of the invention should be determined not by the embodiment illustrated, but by the appended claims and their legal equivalents.

I claim:

1. A piezoelectric transformer, comprising:
   a transformer input portion, said transformer input portion comprising;
      a first input layer of electroactive ceramic having first and second opposing major faces;
      a first input electrode bonded to said first major face of said first input layer; and
      a second input electrode bonded to said second major face of said first input layer;
   a transformer output portion, said transformer output portion comprising;
      a first output layer of electroactive ceramic having first and second opposing major faces, and first and second nonparallel bisectors;
      a first intermediate electrode bonded to and substantially covering said first major face of said first output layer on a first side of said first bisector;
      a second intermediate electrode bonded to and substantially covering said first major face of said first output layer on a second side of said first bisector;
      said first and second intermediate electrodes being electrically isolated from each other on said first major face of said first output layer;
      a first output electrode bonded to and substantially covering said second major face of said first output layer on a first side of said second bisector;
      a second output electrode bonded to and substantially covering said second major face of said first output layer on a second side of said second bisector and on a first side of said first bisector; and
      a third output electrode bonded to and substantially covering said second major face of said first output layer on said second side of said second bisector and on a second side of said first bisector;
      said first, second and third output electrodes being electrically isolated from each other on said second major face of said first output layer; and
   an isolation layer having first and second opposing major faces;
      said first major face of said isolation layer being bonded to said first or second opposing major face of said first input layer;
      said second major face of said isolation layer being bonded to said first or second opposing major face of said first output layer.

2. The piezoelectric transformer according to claim 1, wherein said first input layer has a first cross-section in a plane parallel to said first and second opposing major faces;
   and wherein said first output layer has a second cross-section in a plane parallel to said first and second opposing major faces;
      said first and second cross-sections being substantially equal circular cross-sections.

3. The piezoelectric transformer according to claim 1, wherein said first input layer has a first cross-section in a plane parallel to said first and second opposing major faces;
   and wherein said first output layer has a second cross-section in a plane parallel to said first and second opposing major faces;
      said first and second cross-sections being substantially equal rectangular cross-sections.

4. The piezoelectric transformer according to claim 2, wherein said first and second bisectors comprise first and second perpendicular diameters;
   and wherein said first and second perpendicular diameters divide said first and second faces of said first output layer into first, second, third and fourth substantially equal quadrants.

5. The piezoelectric transformer according to claim 3, wherein said first and second bisectors comprise first and second perpendicular bisectors;
   and wherein said first and second perpendicular bisectors divide said first and second faces of said first output layer into first, second, third and fourth substantially equal quadrants.

6. The piezoelectric transformer according to claim 4, wherein said first input layer is polarized in the thickness direction normal to a plane parallel to said first and second opposing major faces of said first input layer;
   and wherein said first output layer is polarized in the thickness direction normal to a plane parallel to said first and second opposing major faces of said first output layer;
      the direction of polarization in said thickness direction of said first and third quadrants being opposite to the direction of polarization in said thickness direction of said second and fourth quadrants.

7. The piezoelectric transformer according to claim 5, wherein said first input layer is polarized in the thickness direction normal to a plane parallel to said first and second opposing major faces of said first input layer;
   and wherein said first output layer is polarized in the thickness direction normal to a plane parallel to said first and second opposing major faces of said first output layer;
      the direction of polarization in said thickness direction of said first and third quadrants being opposite to the direction of polarization in said thickness direction of said second and fourth quadrants.

8. The piezoelectric transformer according to claim 1, wherein said transformer input portion further comprises:
   a second input layer of electroactive ceramic having first and second opposing major faces; and
   a third input electrode being bonded to said first major face of said second input layer;
   said second major face of said input layer being bonded to said second input electrode.

9. The piezoelectric transformer according to claim 1, wherein said transformer output portion further comprises:
   a second output layer of electroactive ceramic having first and second opposing major faces, and third and fourth nonparallel bisectors;
      said second major face of said second output layer being bonded to second major face of said first output layer and to said first, second and third output electrodes;
      said first, second and third output electrodes substantially covering said second major face of said second output layer;
   said first, second and third output electrodes being electrically isolated from each other on said second major face of said second output layer;

a fourth output electrode bonded to and substantially covering said first major face of said second output layer on a first side of said third bisector;

a fifth output electrode bonded to and substantially covering said first major face of said second output layer on a second side of said third bisector and on a first side of said fourth bisector; and a sixth output electrode bonded to and substantially covering said first major face of said second output layer on said second side of said third bisector and on a second side of said fourth bisector; said fourth, fifth and sixth output electrodes being electrically isolated from each other on said first major face of said second output layer.

10. The piezoelectric transformer according to claim 8, wherein said first and second bisectors comprise third and fourth perpendicular diameters;

and wherein said third and fourth perpendicular diameters divide said first and second faces of said second output layer into fifth, sixth, seventh and eighth substantially equal quadrants;

and wherein said first and third diameters are parallel;

and wherein said second and fourth diameters are parallel.

11. A piezoelectric transformer, comprising:

a transformer input portion, said transformer input portion comprising;
 a first input layer of electroactive ceramic having first and second opposing major faces;
 a first input electrode bonded to said first major face of said first input layer; and
 a second input electrode bonded to said second major face of said first input layer;

a transformer output portion, said transformer output portion comprising;
 a first output layer of electroactive ceramic having first and second opposing major faces, and first, second and third nonparallel bisectors;
 a first intermediate electrode bonded to and substantially covering a first arc segment of said first major face of said first output layer;
 said first arc segment extending between said first bisector and said third bisector across said second bisector and being less than 180 degrees;
 a second intermediate electrode bonded to and substantially covering a second arc segment of said first major face of said first output layer;
 said second arc segment extending between said second bisector and said third bisector across said first bisector and being less than 180 degrees;
 a third intermediate electrode bonded to and substantially covering a third arc segment of said first major face of said first output layer;
 said third arc segment extending between said first bisector and said second bisector across said third bisector and being less than 180 degrees;
 said first, second and third intermediate electrodes being electrically isolated from each other on said first major face of said first output layer;
 a first output electrode bonded to and substantially covering a first arc segment of said second major face of said first output layer;

said first arc segment extending between said first bisector and said third bisector and not across said second bisector and being less than 180 degrees;

a second output electrode bonded to and substantially covering a second arc segment of said second major face of said first output layer;

said second arc segment extending between said first bisector and said second bisector and not across said third bisector and being less than 180 degrees;

a third output electrode bonded to and substantially covering a third second arc segment of said second major face of said first output layer;

said third arc segment extending between said first bisector and said second bisector across said third bisector and being less than 180 degrees;

a fourth output electrode bonded to and substantially covering a fourth arc segment of said second major face of said first output layer;

said fourth arc segment extending between said first bisector and said third bisector across said second bisector and being less than 180 degrees;

said first, second, third and fourth output electrodes being electrically isolated from each other on said second major face of said first output layer; and an isolation layer having first and second opposing major faces;
 said first major face of said isolation layer being bonded to said first or second opposing major face of said first input layer;
 said second major face of said isolation layer being bonded to said first or second opposing major face of said first output layer.

12. The piezoelectric transformer according to claim 11, wherein said first input layer has a first cross-section in a plane parallel to said first and second opposing major faces;

and wherein said first output layer has a second cross-section in a plane parallel to said first and second opposing major faces;
 said first and second cross-sections being substantially equal circular cross-sections.

13. The piezoelectric transformer according to claim 12, wherein said first, second and third bisectors comprise first, second and third diameters having a 120 degree angle orientation relative to each other;

and wherein said first, second and third diameters divide said first and second faces of said first output layer into first, second, third, fourth, fifth and sixth substantially equal sextants.

14. The piezoelectric transformer according to claim 13, wherein said first input layer is polarized in the thickness direction normal to a plane parallel to said first and second opposing major faces of said first input layer;

and wherein said first output layer is polarized in the thickness direction normal to a plane parallel to said first and second opposing major faces of said first output layer;
 the direction of polarization in said thickness direction of said first, third and fifth sextants being opposite to the direction of polarization in said thickness direction of said second, fourth and sixth sextants.

* * * * *